United States Patent
Ono et al.

(10) Patent No.: US 6,927,838 B2
(45) Date of Patent: Aug. 9, 2005

(54) MULTIPLE STAGE, STAGE ASSEMBLY HAVING INDEPENDENT STAGE BASES

(75) Inventors: Kazuya Ono, San Carlos, CA (US); Douglas C. Watson, Campbell, CA (US); Andrew Hazelton, San Carlos, CA (US)

(73) Assignee: Nikon Corporation (JP)

( * ) Notice: Subject to any disclaimer, the term of this patent is extended or adjusted under 35 U.S.C. 154(b) by 369 days.

(21) Appl. No.: 09/796,332

(22) Filed: Feb. 27, 2001

(65) Prior Publication Data

US 2004/0233412 A1 Nov. 25, 2004

(51) Int. Cl.$^7$ ............................................. G03B 27/42
(52) U.S. Cl. ........................... 355/72; 355/53; 355/75; 318/560; 318/568.17; 318/611; 318/649; 310/10
(58) Field of Search ............................. 355/53, 72–77; 250/492.1, 492.2; 310/10, 12; 318/560, 611, 568.17, 649

(56) References Cited

U.S. PATENT DOCUMENTS

| | | | |
|---|---|---|---|
| 5,040,431 A | * | 8/1991 | Sakino et al. ............... 355/53 |
| 5,677,758 A | * | 10/1997 | McEachern et al. .......... 355/53 |
| 5,815,246 A | | 9/1998 | Sperling et al. .............. 355/53 |
| 5,959,427 A | * | 9/1999 | Watson ....................... 318/560 |
| 5,969,441 A | | 10/1999 | Loopstra et al. .............. 310/12 |
| 6,281,655 B1 | * | 8/2001 | Poon et al. ............. 318/568.17 |
| 6,304,320 B1 | * | 10/2001 | Tanaka et al. ................ 355/73 |
| 6,417,914 B1 | * | 7/2002 | Li ............................... 355/72 |
| 2001/0006762 A1 | | 7/2001 | Kwan et al. |
| 2002/0015140 A1 | | 2/2002 | Yoda |

FOREIGN PATENT DOCUMENTS

| | | |
|---|---|---|
| JP | 2001-203140 A | 7/2001 |
| WO | WO 98/28665 | 7/1998 |
| WO | WO 98/40791 | 9/1998 |

* cited by examiner

*Primary Examiner*—D. Rutledge
(74) *Attorney, Agent, or Firm*—Steven G. Roeder; Jim Rose

(57) ABSTRACT

A stage assembly (10) for independently moving and positioning a first device (26A) and a second device (26A) in an operation area (25) is provided herein. The stage assembly (10) includes a stage base (12), a first stage (14), a first mover assembly (15), a second stage (16), and a second mover assembly (18). The first mover assembly (15) moves the first stage (14) and the first device (26A) into the operational area (25) and the second mover assembly (18) moves the second stage (16) and the second device (26B) into the operational area (25). The present stage assembly (10) reduces and minimizes the amount of reaction forces and disturbances that are transferred between the stages (14), (16). This improves the positioning performance of the stage assembly (10). Further, for an exposure apparatus (30), this allows for more accurate positioning of two semiconductor wafers (28) relative to a reticle (32) or some other reference.

53 Claims, 16 Drawing Sheets

MULTIPLE STAGE, STAGE ASSEMBLY HAVING INDEPENDENT STAGE BASES

FIELD OF THE INVENTION

The present invention is directed to a stage assembly for moving a device. More specifically, the present invention is directed to a stage assembly having two stages that move independently. Uniquely, the stage assembly reduces and minimizes the amount of reaction forces that are transferred between the stages.

BACKGROUND

Exposure apparatuses are commonly used to transfer images from a reticle onto a semiconductor wafer during semiconductor processing. A typical exposure apparatus includes an illumination source, a reticle stage assembly that retains a reticle, a lens assembly and a wafer stage assembly that retains a semiconductor wafer. The reticle stage assembly and the wafer stage assembly are supported above a mounting base with an apparatus frame.

Recently, in order to increase the throughput of the exposure apparatus, wafer stage assemblies have been developed that include two wafer stages. In this design, each wafer stage retains a wafer. Further, each wafer stage independently and alternately moves one of the wafers into an operational area for processing the wafers. Typically, the wafer stage assembly includes a wafer stage base and a wafer mover assembly that precisely positions the wafer stages relative to the wafer stage base.

The size of the images transferred onto the wafers from the reticle is extremely small. Accordingly, the precise positioning of the wafers and the reticle is critical to the manufacturing of high density, semiconductor wafers.

Unfortunately, the wafer mover assembly generates reaction forces that can vibrate the wafer stage base, the wafer stages, and the apparatus frame. The vibration influences the position of the wafer stage base, the wafer stages, and the wafers. This also reduces the accuracy of positioning of the wafers relative to the reticle and degrades the accuracy of the exposure apparatus.

In light of the above, there is a need for a stage assembly that precisely positions two devices independently in an operational area. Further, there is a need for a stage assembly having two stages that move independently and that minimizes the influence of the reaction forces of the mover assembly upon the position of the stages, the stage base, and the apparatus frame. Moreover, there is a need for an exposure apparatus capable of manufacturing precision devices such as high density, semiconductor wafers.

SUMMARY

The present invention is directed to a stage assembly for moving a first device and a second device independently into an operational area that meets these needs. The stage assembly includes a stage base, a first stage, a second stage, a first mover assembly, and a second mover assembly. The first stage retains the first device and the second stage retains the second device. The first mover assembly moves the first stage and the first device into the operational area and the second mover assembly moves the second stage and the second device into the operational area. Additionally, the first mover assembly generates first reaction forces during movement of the first stage and the second mover assembly generates second reaction forces during movement of the second stage.

Uniquely, with the designs provided herein, the second stage is uncoupled from at least a portion and more preferably, substantially all of the first reaction forces. Further, the first stage is uncoupled from at least a portion and more preferably, substantially all of the second reaction forces. This feature minimizes and reduces the amount of reaction forces and disturbances that are transferred between the stages and improves the positioning performance of the stage assembly. Further, for a stage assembly used in an exposure apparatus, this allows for more accurate positioning of each semiconductor wafer relative to a reticle or some other reference and the manufacture of higher density, higher quality semiconductor wafers.

As used herein, the term "operational area" shall mean and include a specific location in physical space. For an exposure apparatus, the operational area can be a specific location that is positioned a specific distance along the X axis, the Y axis and the Z axis away from an optical assembly. Further, for an exposure apparatus, the operational area is the desired location for processing of the semiconductor wafer. Typically, the operational area is the area in which the wafer or some portion thereof is underneath an optical assembly in a position where an image can be transferred to the wafer. The operational area can also be an area where another operation is performed, such as alignment.

As used herein, the term "uncoupled" regarding two stages shall mean and include when motion of, or forces exerted by one of the stages have little of no effect on motion of the other stage.

A number of embodiments are provided herein. In one embodiment, the stage assembly includes a first reaction frame assembly and a second reaction frame assembly that secure the mover assemblies to a mounting base. In this embodiment, the first mover assembly is coupled to the first reaction frame assembly and the second mover assembly is coupled to the second reaction frame assembly. More specifically, the first mover assembly includes a first X mover system that moves the first stage along an X axis, and the second mover assembly includes a second X mover system that moves the second stage along the X axis. In this design, at least a portion of the first X mover system is secured to the first reaction frame assembly and at least a portion of the second X mover system is secured to the second reaction frame assembly. With this design, the first reaction forces and the second reaction forces are independently transferred to the mounting base. As a result of this design, the amount of reaction forces and disturbances that are transferred between the stages is minimized.

As provided herein, the first X mover system includes a left first X mover and a right first X mover and the second X mover system includes a left second X mover and a right second X mover. In one embodiment of the stage assembly, the left first X mover is positioned below the left second X mover and the right first X mover is positioned above the right second X mover. As a result of this design, the first X movers can push through a center of gravity of the first stage and the second X movers can push through a center of gravity of the second stage. Furthermore, as a result of this design, the stage assembly can separately position two devices in the operational area.

In another embodiment of the stage assembly, the left first X mover is positioned between the second X movers and the right second X mover is positioned between the first X movers. Also, with this design, the first X movers can push through the center of gravity of the first stage and the second X movers can push through the center of gravity of the second stage.

In yet another embodiment of the stage assembly, the first X mover system and the second X mover system can share a common reaction component that is secured to the mounting base. In this design, the common reaction component includes a plurality of spaced apart component segments that are preferably secured to the mounting base with a flexible support assembly. In this design, when one of the stages is in the operational area, the first X mover system is not interacting with the same component segments as the second X mover system. Thus, the multiple component segments minimize the amount of reaction forces and disturbances that are transferred between the stages.

In still another embodiment, the stage base includes a first base section and a second base section. In this embodiment, the first base section supports the first stage and the second base section supports the second stage. Preferably, the first base section is secured to the mounting base with one or more first base flexible supports and the second base section is secured to the mounting base with one or more second base flexible supports. As a result of this design, the amount of reaction forces and disturbances that are transferred between the stages is minimized.

The present invention is also directed to an exposure apparatus, a device, a semiconductor wafer, method for making a stage assembly, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
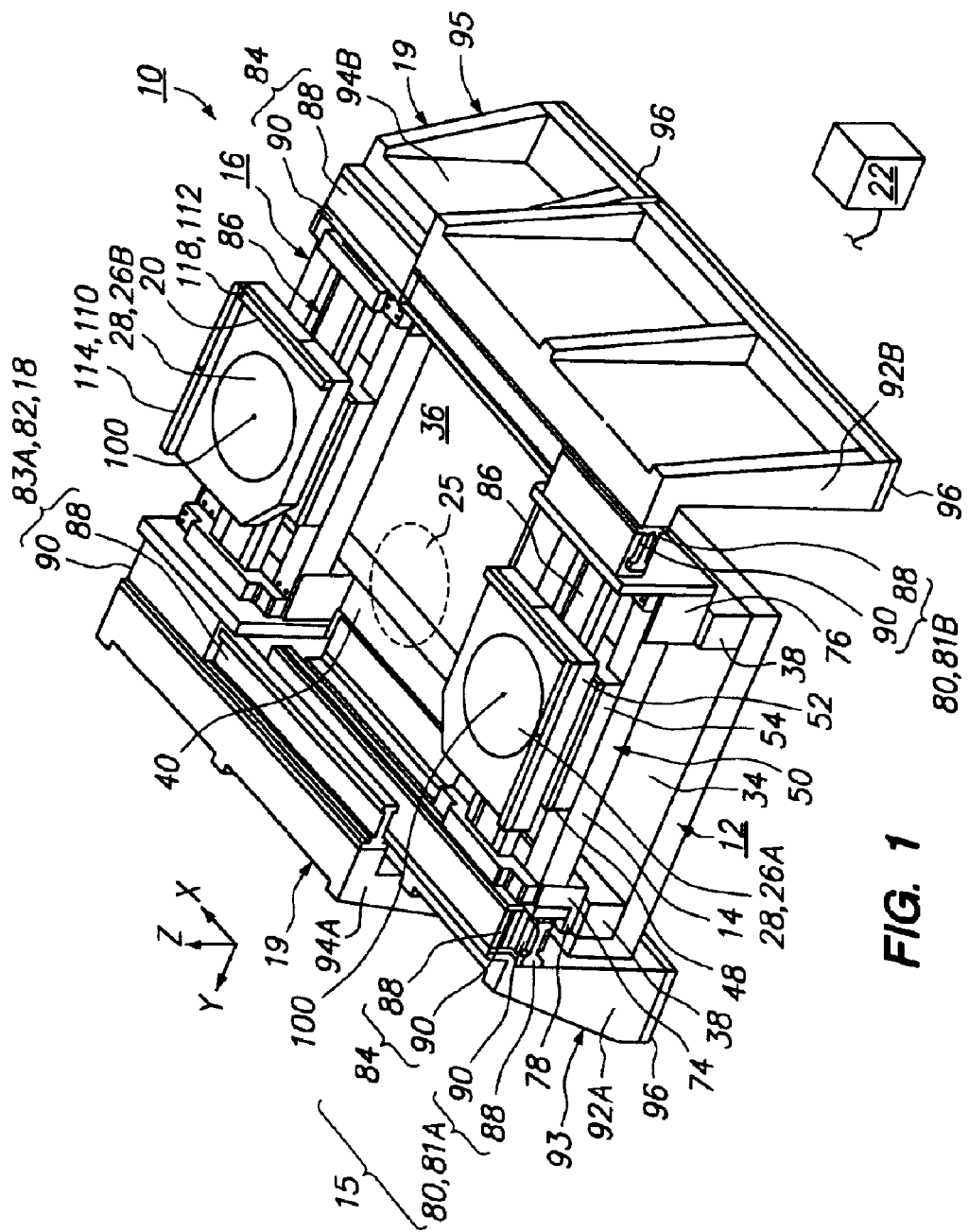
FIG. 1 is a perspective view of a first embodiment of a stage assembly having features of the present invention.
Figure 2:
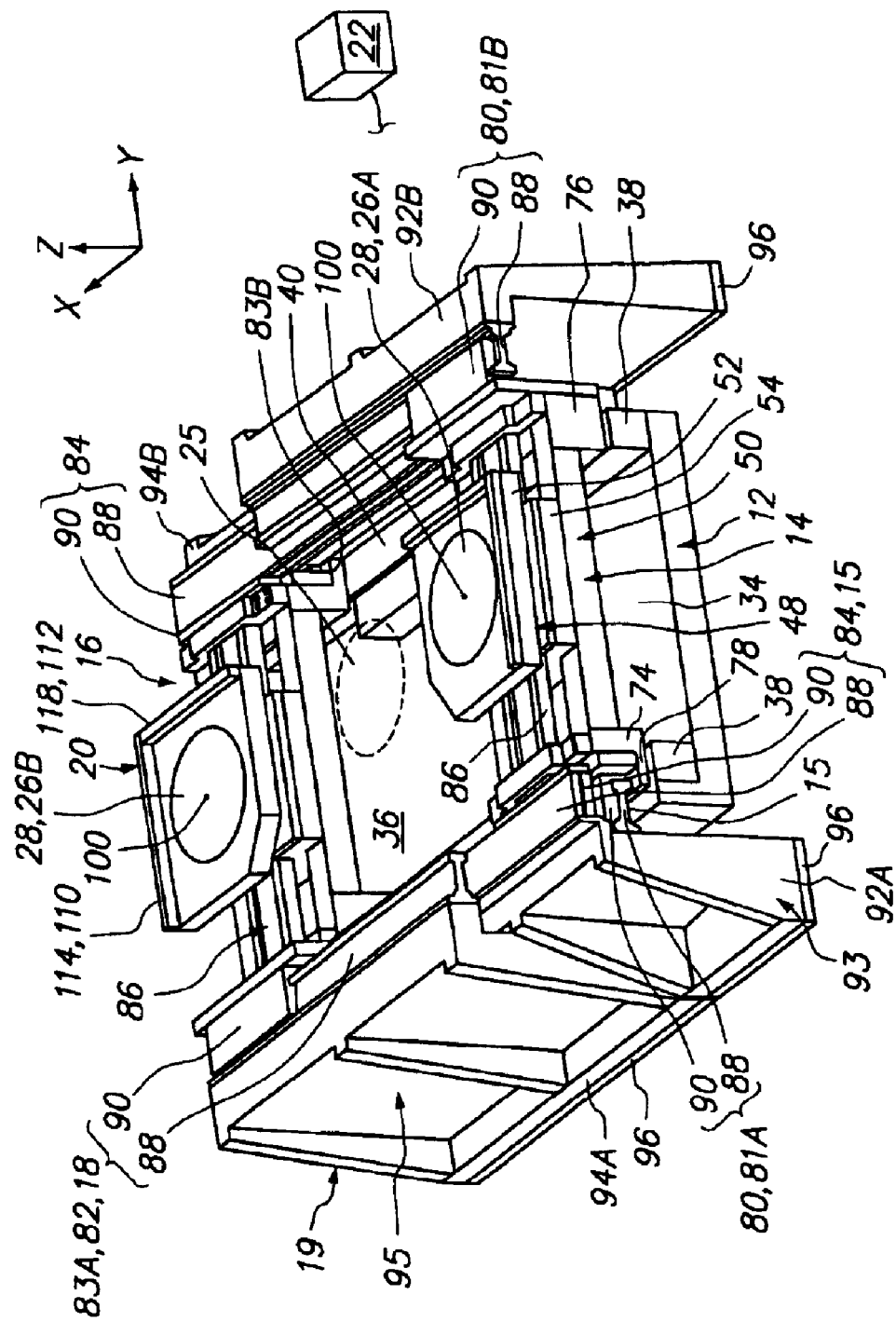
FIG. 2 is another perspective view of the stage assembly of FIG. 1.

Referring initially to FIGS. 1–4, a stage assembly 10, having features of the present invention, includes a stage base 12, a first stage 14, a first mover assembly 15, a second stage 16, a second mover assembly 18, a reaction mounting assembly 19, a measurement system 20, and a control system 22. The stage assembly 10 is typically positioned above a mounting base 24 (illustrated in FIG. 12).

The first mover assembly 15 moves the first stage 14 relative to the stage base 12 into and out of an operational area 25 (illustrated in phantom in FIGS. 1, 2, 4, 6, 7 and 9) and the second mover assembly 18 moves the second stage 16 relative to the stage base 12 into and out of the same operational area 25. As an overview, the present design reduces and minimizes the amount of reaction forces that are transferred between the stages 14, 16.

The stage assembly 10 is particularly useful for precisely and independently positioning a first device 26A and a second device 26B during a manufacturing and/or an inspection process performed in the operational area 25. However, with the embodiments provided herein, the stage assembly 10 could be used to position more than or less than two devices.

The type of devices 26A, 26B positioned and moved by the stage assembly 10 can be varied. For example, each device 26A, 26B can be a semiconductor wafer 28, and the stage assembly 10 can be used as part of an exposure apparatus 30 (illustrated in FIG. 12) for precisely positioning the semiconductor wafers 28 during manufacturing of the semiconductor wafers 28. Alternately, for example, the stage assembly 10 can be used to move other types of devices during manufacturing and/or inspection, to move devices under an electron microscope (not shown), or to move devices during a precision measurement operation (not shown).

Some of the Figures provided herein include a coordinate system that designates an X axis, a Y axis, and a Z axis. It should be understood that the coordinate system is merely for reference and can be varied. For example, the X axis can be switched with the Y axis and/or the stage assembly 10 can be rotated.

Figure 6:
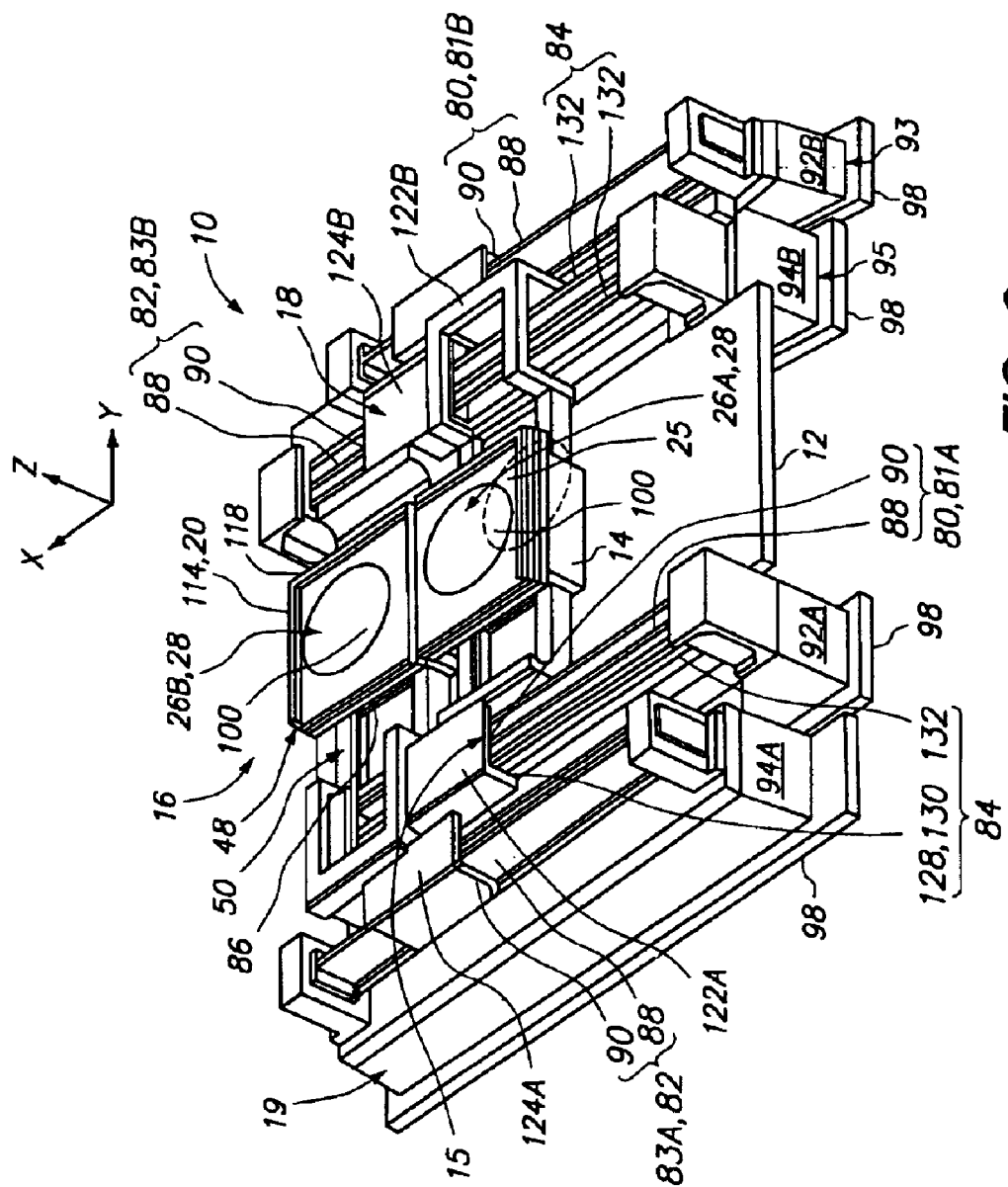
FIG. 6 is a perspective view of a second embodiment of a stage assembly having features of the present invention.
Figure 7:
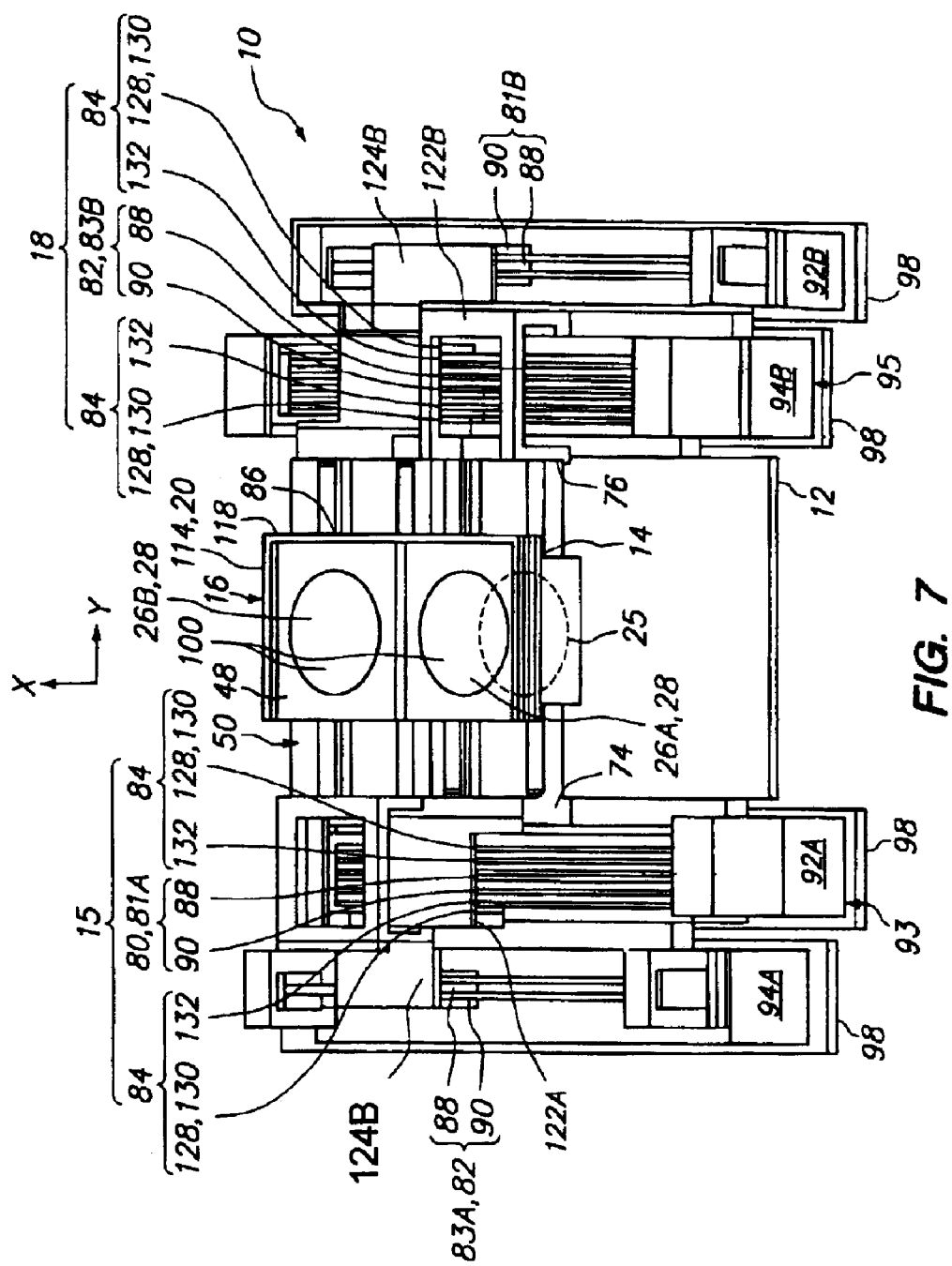
FIG. 7 is another perspective view of the stage assembly of FIG. 6.
Figure 9:
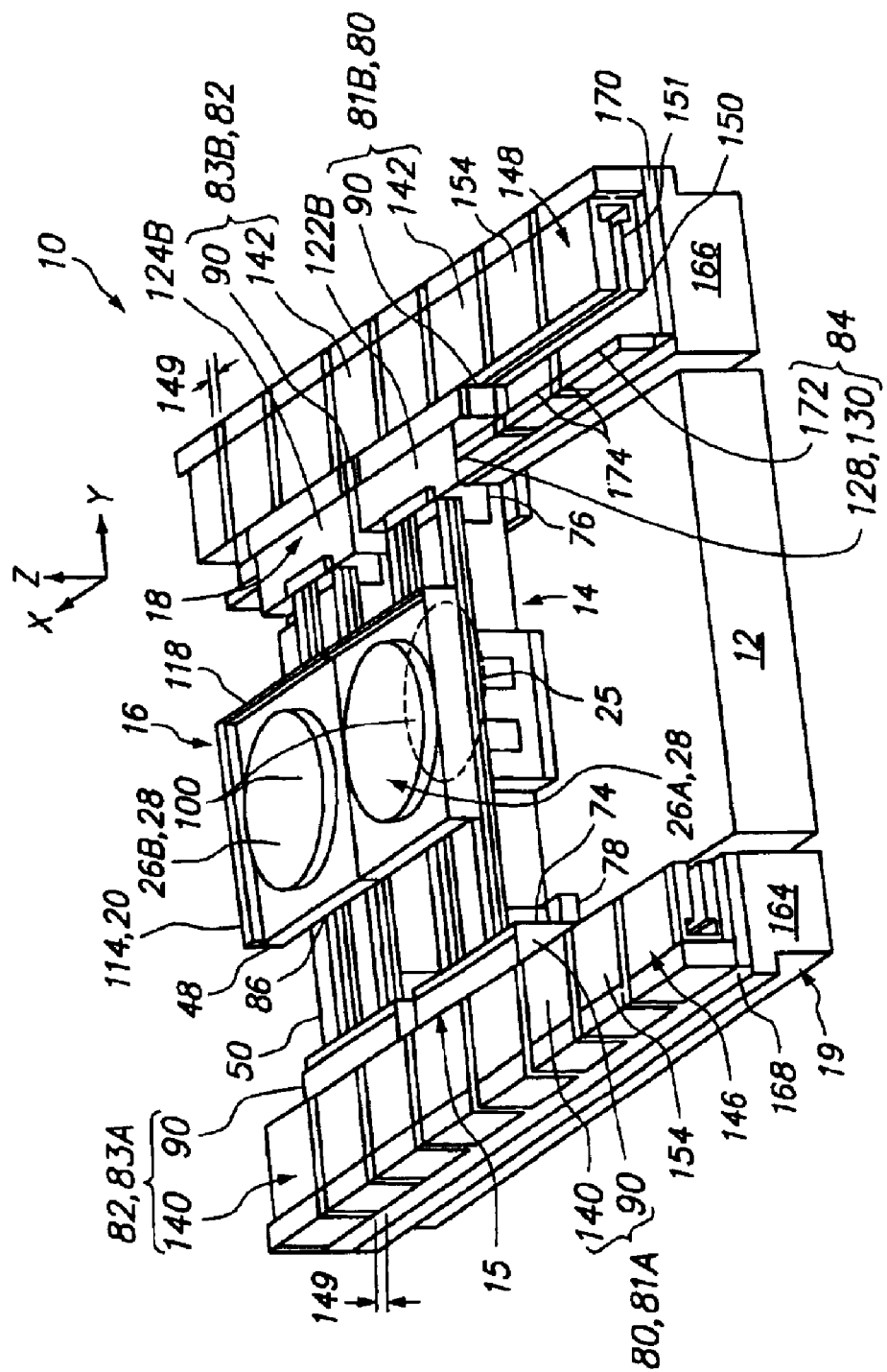
FIG. 9 is a perspective view of a third embodiment of a stage assembly having features of the present invention.

A number of alternate embodiments of the stage assembly 10 are illustrated in the Figures. In particular, FIGS. 1–4 illustrate a first embodiment of the stage assembly 10, FIGS. 6 and 7 illustrate a perspective view of a second embodiment of the stage assembly 10, and FIG. 9 illustrates a perspective view of a third embodiment of the stage assembly 10. In each embodiment illustrated herein, each of the stages 14, 16 can be moved independently relative to the stage base 12 along the X axis, along the Y axis, and about the Z axis (collectively "the planar degrees of freedom") into and out of the operational area 25. More specifically, the first mover assembly 15 independently moves and positions the first stage 14 along the X axis, along the Y axis, and about the Z axis under the control of the control system 22 and the second mover assembly 18 independently moves and positions the second stage 16 along the X axis, along the Y axis, and about the Z axis under the control of the control system 22.

As an overview, the first mover assembly 15 generates first reaction forces during movement of the first stage 14. Somewhat similarly, the second mover assembly 18 generates second reaction forces during movement of the second stage 16. Importantly, at least a portion, and more preferably, substantially all of the first reaction forces generated by the first mover assembly 15 are uncoupled from the second stage 16. Further, at least a portion, and more preferably, substantially all of the second reaction forces generated by the second mover assembly 18 are uncoupled from the first stage 14. Stated another way, the first mover assembly 15 is substantially uncoupled from the second mover assembly 18. Stated yet another way, the first reaction forces and the second reaction forces are independently transferred to the mounting base 24. This feature minimizes and reduces the amount of reaction forces and disturbances that are transferred between the stages 14, 16. This also improves the positioning performance of the stage assembly 10. Further, for an exposure apparatus 30, this allows for more accurate positioning of each semiconductor wafer 28 relative to a reticle 32 (illustrated in FIG. 12) or some other reference such as an optical assembly 200 (illustrated in FIG. 12).

The stage base 12 supports a portion of the stage assembly 10 above the mounting base 24. The design of the stage base 12 can be varied to suit the design requirements of the stage assembly 10. In the embodiment illustrated in FIGS. 1–4, the stage base 12 includes a first base section 34 and a second base section 36. Referring to FIGS. 5A, 5B, 5C and 5D, the first base section 34 includes a first base bottom 35, a left first base guide 38A and a spaced apart right, first base guide 38B for supporting and guiding the first stage 14. Somewhat similarly, the second base section 36 includes a second base bottom 39, a left second base guide 40A and a spaced apart right, second base guide 40B for supporting and guiding the second stage 16.

In this embodiment, each base bottom 35, 39 is generally flat, plate shaped. Further, each base guide 38A, 38B, 40A, 40B is generally rectangular block shaped and extends above the respective base bottom 35, 39. Moreover, the base guides 38A, 38B, 40A, 40B are positioned substantially parallel to each other. The left first base guide 38A is positioned adjacent to the left second base guide 40A and the right first base guide 38B is positioned adjacent to the right second base guide 40B. It should be noted that the first base guides 38A, 38B cantilever away from the first base bottom 35 and the second base guides 40A, 40B cantilever away from the second base bottom 39. With this design, the left second base guide 40A is positioned over a portion of the first base bottom 35 and the right first base guide 38B is positioned over a portion of the second base bottom 39. Further, the left second base guide 40A is positioned between the first base guides 38A, 38B and the right first base guide 38B is positioned between the second base guides 40A, 40B. This design allows the stage assembly 10 to position each stage 14, 16 in the operational area 25.

In this embodiment, the first stage 14 and the second stage 16 are maintained above the stage base 12 with a vacuum preload type fluid bearing. More specifically, in this embodiment, each of the stages 14, 16 includes a plurality of spaced apart fluid outlets (not shown), and a plurality of spaced apart fluid inlets (not shown). Pressurized fluid (not shown) is released from the fluid outlets of the first stage 14 towards the first base guides 38A, 38B and a vacuum is pulled in the fluid inlets to create a vacuum preload type, fluid bearing between the first stage 14 and the first base guides 38A, 38B. Similarly, pressurized fluid (not shown) is released from the fluid outlets of the second stage 16 towards the second base guides 40A, 40B and a vacuum is pulled in the fluid inlets to create a vacuum preload type, fluid bearing between the second stage 16 and the second base guides 40A, 40B. The vacuum preload type fluid bearings maintain the stages 14, 16 spaced apart along the Z axis, relative to the stage base 12. Further, the vacuum preload type fluid bearings allow for motion of the stages 14, 16 along the X axis, along the Y axis, and about the Z axis relative to the stage base 12.

Alternately, the stages 14, 16 can be supported spaced apart from the stage base 12 in other ways. For example, a magnetic type bearing (not shown) or a roller bearing type assembly (not shown) could be utilized that allows for motion of the stages 14, 16 relative to the stage base 12.

Figure 12:
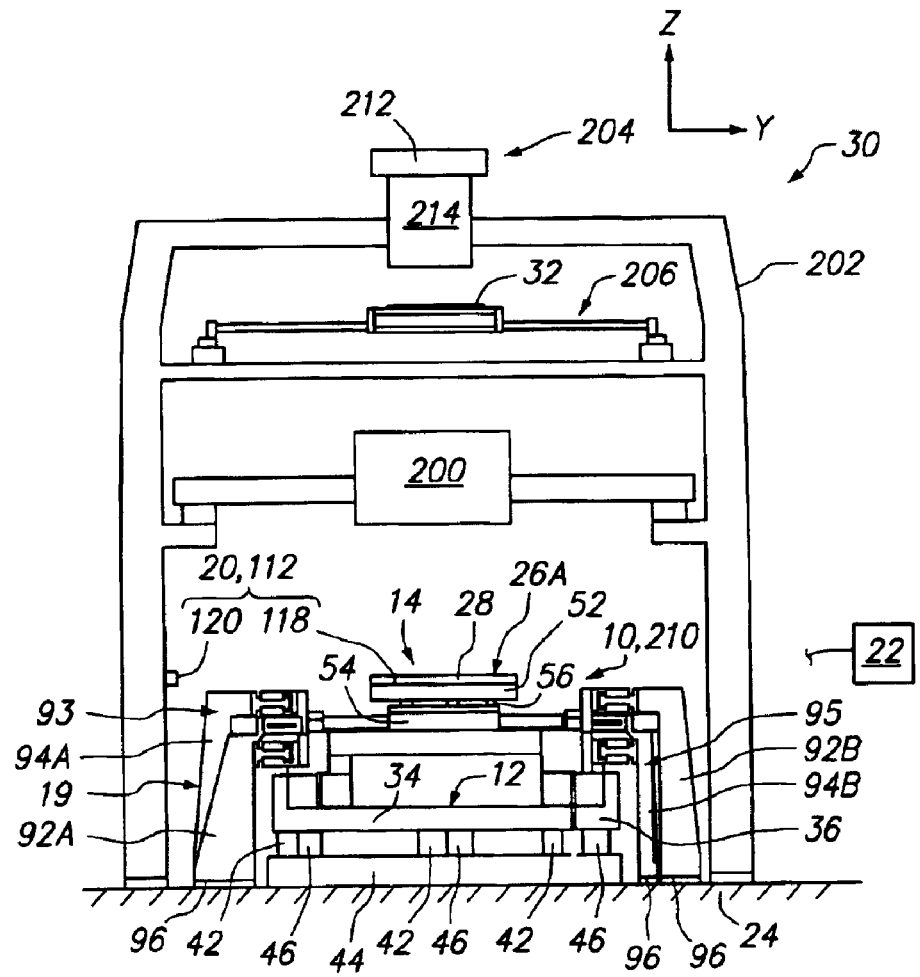
FIG. 12 is a schematic illustration of an exposure apparatus having features of the present invention.

Preferably, referring to FIG. 12, the first base section 34 is secured with one or more first base flexible supports 42 and a base apparatus frame 44 to the mounting base 24 and the second base section 36 is secured with one or more second base flexible supports 46 and the base apparatus frame 44 to the mounting base 24. The base flexible supports 42, 46 reduce the effect of vibration of the base apparatus frame 44 and the mounting base 24 causing vibration on the stage base 12. in the embodiment illustrated in FIG. 12, three spaced apart first base flexible supports 42 support the first base section 34 and three spaced apart second base flexible supports 46 support the second base section 36. Each of the base flexible supports 42, 46 can include a pneumatic cylinder (not shown) and one or more actuators (not shown). Suitable base flexible supports 42, 46 are sold by Technical Manufacturing Corporation, located in Peabody, Mass., or Newport Corporation located in Irvine, Calif.

It should be noted that in this embodiment, each of the stages 14, 16 is supported by different base guides 38, 40 and different base flexible supports 42, 46. This feature helps to isolate the first stage 14 from the second stage 16. Alternately, for example, each of stages could be supported by a one piece stage base as discussed below.

Figure 5A:
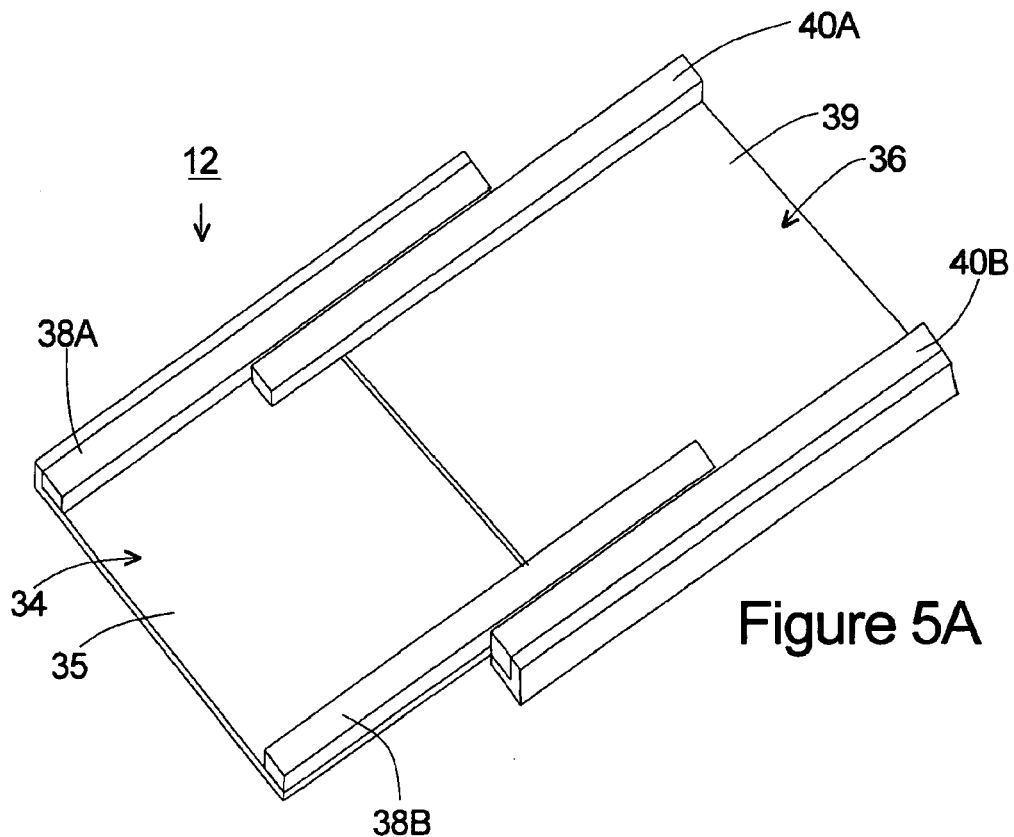
FIG. 5A is a top perspective view of a stage base having features of the present invention.
Figure 5B:
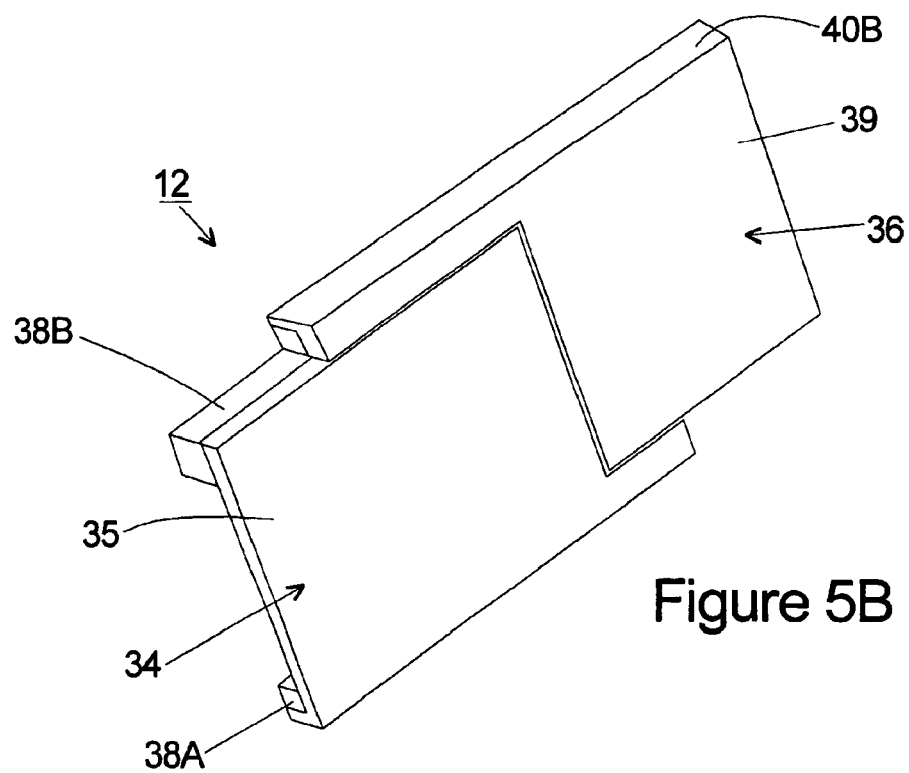
FIG. 5B is a bottom perspective view of the stage base of FIG. 5B.
Figure 5C:
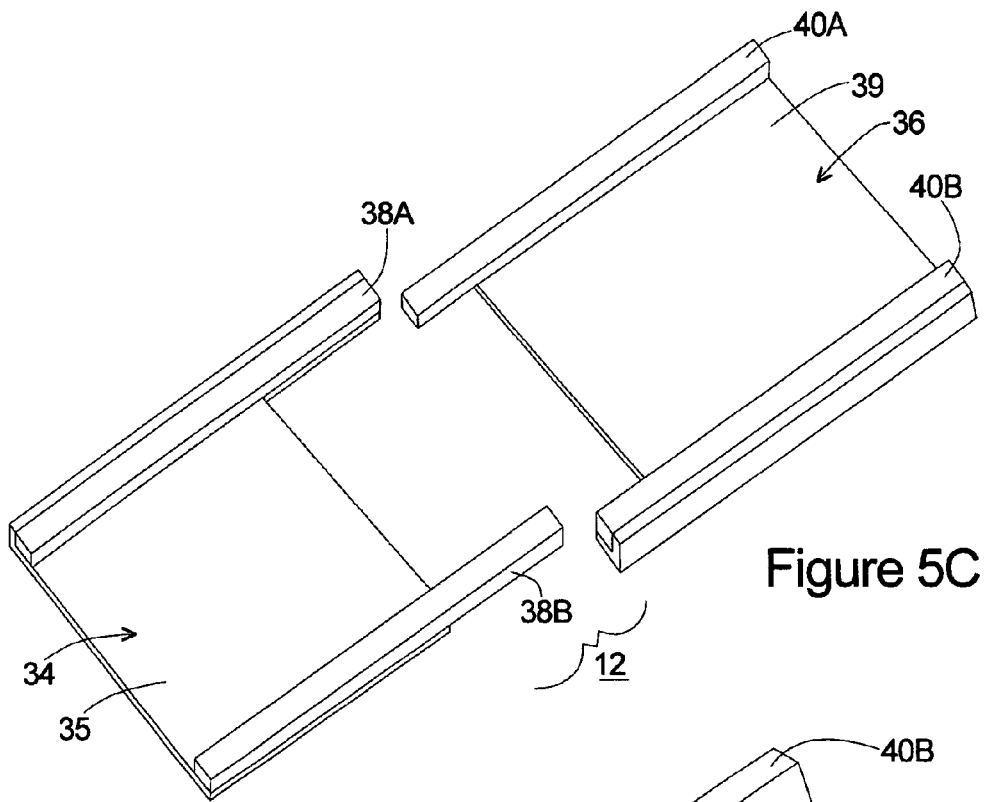
FIG. 5C is a top, exploded view of the stage base of FIG. 5A.
Figure 5D:
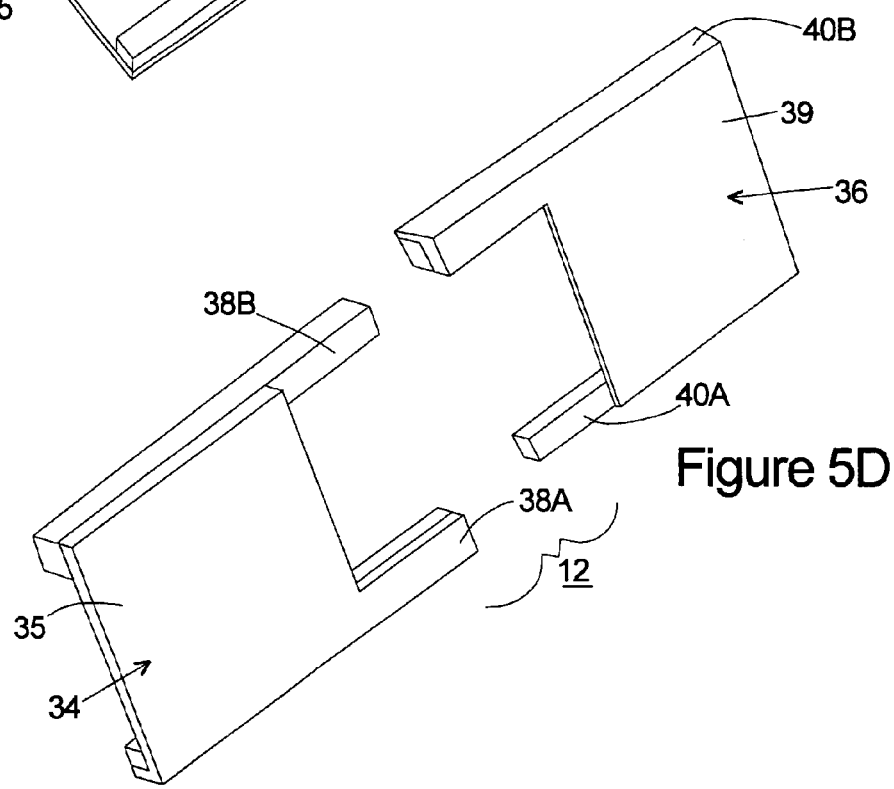
FIG. 5D is a bottom, exploded view of the stage base of FIG. 5A.
Figure 5E:
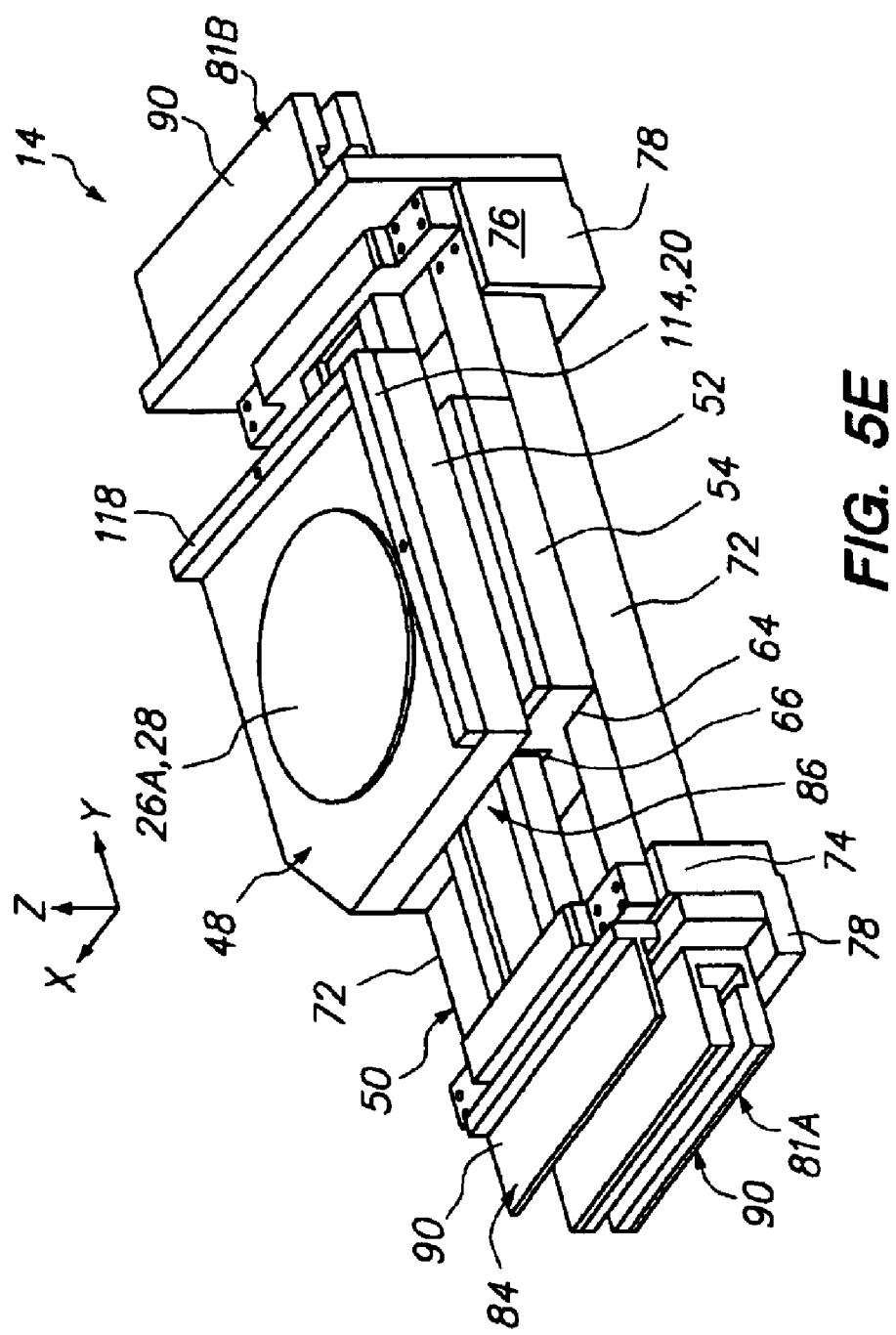
FIG. 5E is a perspective view of a first stage having features of the present invention.
Figure 5F:
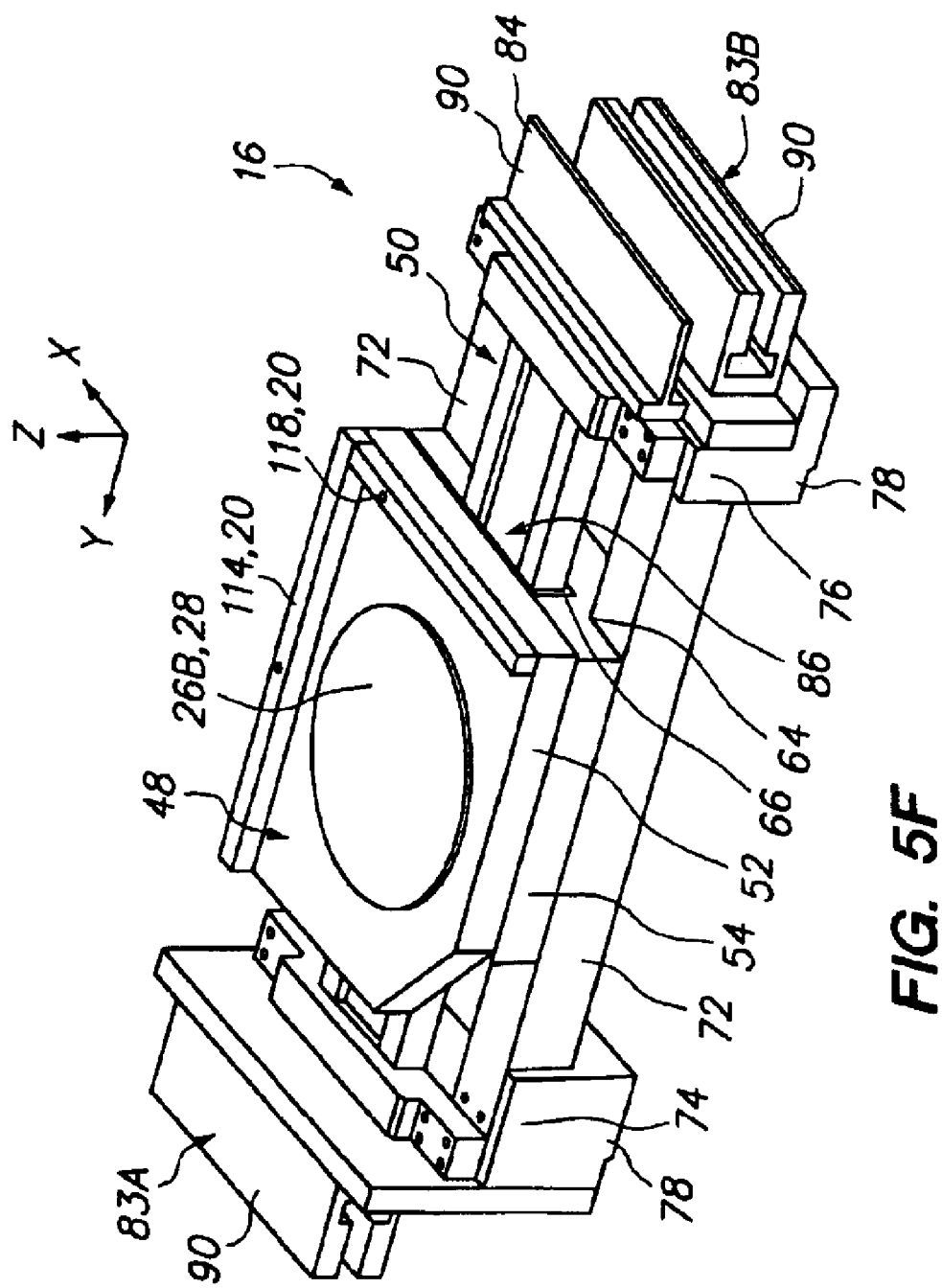
FIG. 5F is a perspective view of a second stage having features of the present invention.

Each of the stages 14, 16 retains and positions one of the devices 26A, 26B. More specifically, the first stage 14 is precisely moved by the first mover assembly 15 to precisely position the first device 26A and the second stage 16 is precisely moved by the second mover assembly 18 to precisely position the second device 26B. The design of each of the stages 14, 16 can be varied to suit the design requirements of the stage assembly 10. A perspective view of the first stage 14 is provided in FIG. 5E and a perspective view of the second stage 16 is provided in FIG. 5F. Each of the stages 14, 16 includes a device table 48, a guide assembly 50, and a portion of the measurement system 20. Additionally, the first stage 14 includes a portion of the first mover assembly 15 and the second stage 16 includes a portion of the second mover assembly 18.

The design and movement of the device table 48 for each of the stages 14, 16 can be varied. In the embodiment illustrated in FIGS. 5E and 5F, the device table 48 moves relative to the guide assembly 50 along the Y axis for each stage 14, 16. Further, for each stage 14, 16, the device table 48 includes: (i) an upper table component 52, (ii) a lower table component 54 positioned below the upper table component 52, and (iii) a table mover assembly 56. In this design, for each stage 14, 16, the upper table component 52 is moved relative to the lower table component 54 by the table mover assembly 56.

The upper table component 52, for each stage 14, 16, is generally rectangular shaped. The upper table component 52 includes a device holder (not shown) and a portion of the measurement system 20. The device holder retains the device 26 during movement. The device holder can be a vacuum chuck, an electrostatic chuck, or some other type of clamp.

The lower table component 54, for each stage 14, 16 is somewhat rectangular shaped and includes a pair of spaced apart, generally rectangular shaped, notches 64, and a generally rectangular tube shaped mover opening 66. The notches 64 and the mover opening 66 extend longitudinally along the lower table component 54. The notches 64 allow a portion of the lower table component 54 to fit within a portion of the guide assembly 50 for each stage 14, 16.

In this embodiment, the device table 48 for each stage 14, 16 is maintained above the guide assembly 50 with a vacuum preload type fluid bearing. More specifically, in this embodiment, the lower table component 54, for each stage 14, 16, includes a plurality of spaced apart fluid outlets (not shown), and a plurality of spaced apart fluid inlets (not shown). For each stage 14, 16, pressurized fluid (not shown) is released from the fluid outlets near the notches 64 towards the guide assembly 50 and a vacuum is pulled in the fluid inlets to create a vacuum preload type, fluid bearing between the lower table component 54 and the guide assembly 50. The vacuum preload type fluid bearings maintain the device table 48 spaced apart along the X axis and the Z axis relative to the guide assembly 50 for each stage 14, 16. Further, the vacuum preload type fluid bearing allows for motion of the device table 48 along the Y axis relative to the guide assembly 50 and stage base 12 for each of the stages 14, 16.

Alternately, the device table 48 can be supported spaced apart from the guide assembly 50 in other ways. For example, a magnetic type bearing (not shown) or a roller bearing type assembly (not shown) could be utilized that allows for motion of the device table 48 for each of the stages 14, 16 relative to the stage base 12.

The mover opening 66 is sized and shaped to receive a portion of the respective mover assembly 15, 18. Further, another portion of the respective mover assembly 15, 18 is positioned near the mover opening 66 as discussed below.

The table mover assembly 56 adjusts the position of the upper table component 52 relative to the lower table component 54 of the device table 48 and the stage base 12. The design of the table mover assembly 56 can be varied to suit the design requirements to the stage assembly 10. For example, the table mover assembly 56 can adjust the position of the upper table component 52 and the device holder relative to the lower table component 54 with six degrees of freedom. Alternately, for example, the table mover assembly 56 can be designed to move the upper table component 52 relative to the lower table component 54 with only three degrees of freedom. The table mover assembly 56 can include one or more rotary motors, voice coil motors, linear motors, electromagnetic actuators, or other type of actuators. Still alternately, the upper table component 52 could be fixed to the lower table component 54.

The guide assembly 50 for each stage 14, 16 is used to constrain the device table 48 along the X axis and the Z axis, and about the X, Y, and Z axis and guide the movement of the device table 48 along the Y axis. The design of the guide assembly 50 can be varied to suit the design requirements of the stage assembly 10. In the embodiment illustrated in FIGS. 5E and 5F, the guide assembly 50, for each stage 14, 16, includes a pair of spaced apart lower guides 72, a first guide end 74, and a spaced apart second guide end 76.

The lower guides 72 are spaced apart, substantially parallel, and extend between the guide ends 74, 76. Each of the lower guides 72 is somewhat rectangular shaped. The lower guides 72 support and guide the movement of the device table 48 relative to the guide assembly 50 for each stage 14, 16.

The guide ends 74, 76 secure the lower guides 72, and secure a portion of the respective mover assembly 15, 18 to the guide assembly 50. Additionally, each of the guide ends 74, 76 includes a guide fluid pad 78 that is positioned adjacent to one of the base guides 38, 40. In this embodiment, each of the guide fluid pads 78 includes a plurality of spaced apart fluid outlets (not shown), and a plurality of spaced apart fluid inlets (not shown). Pressurized fluid (not shown) is released from the fluid outlets towards the respective base guides 38, 40 and a vacuum is pulled in the fluid inlets to create a vacuum preload type, fluid bearing between each of the guide fluid pads 78 and the respective base guides 38, 40. The vacuum preload type, fluid bearing maintains the guide assembly 50 spaced apart along the Z axis relative to the stage base 12 and allows for motion of the guide assembly 50 along the X axis, along the Y axis, and about the Z axis relative to the stage base 12.

The components of each stage 14, 16 can be made of a number of materials including ceramic, such as alumina or silicon carbide; metals such as aluminum; composite materials; or plastic.

The first mover assembly 15 controls and moves the first stage 14 relative to the stage base 12 and the second mover assembly 18 controls and moves the second stage 16 relative to the stage base 12. When the first mover assembly 15 applies a force to move the first stage 14 along the X axis, the Y axis, and/or about the Z axis, an equal and opposite first reaction force is applied to the reaction mounting assembly 19. Similarly, when the second mover assembly 18 applies a force to move the second stage 16 along the X axis, the Y axis, and/or about the Z axis, an equal and opposite second reaction force is applied to the reaction mounting assembly 19.

The design of each of the mover assemblies 15, 18 and the movement of the stages 14, 16 can be varied to suit the movement requirements of the stage assembly 10. In the embodiment illustrated in FIGS. 1–4, each of the mover assemblies 15, 18 moves the respective stage 14, 16 with a relatively large displacement along the X axis, a relatively large displacement along the Y axis, and a limited displacement about the Z axis (theta Z) relative to the stage base 12.

In this embodiment, (i) the first mover assembly 15 includes a first X mover system 80 having a left first X mover 81A and a right first X mover 81B, and (ii) the second mover assembly 18 includes a second X mover system 82 having a left second X mover 83A and a right second X mover 83B. Further, each of the mover assemblies 15, 18 includes a Y guide mover 84 and a Y stage mover 86. The X stage mover systems 80, 82 move the respective stage 14, 16 along the X axis and about the Z axis. The Y guide mover 84 moves the respective guide assembly 50 along the Y axis and the Y stage mover 86 moves the respective stage 14, 16 along the Y axis. More specifically, in this embodiment, for each stage 14, 16, (i) the X stage mover systems 80, 82 move the guide assembly 50 with a relatively large displacement along the X axis and with a limited range of motion about the Z axis (theta Z), (ii) the Y guide mover 84 moves the guide assembly 50 with a small displacement along the Y axis, and (iii) the Y stage mover 86 moves the device table 48 with a relatively large displacement along the Y axis.

The design of each mover 81A, 81B, 83A, 83B, 84, 86 can be varied to suit the movement requirements of the stage assembly 10. As provided herein, each mover 81A, 81B, 83A, 83B, 84, 86 includes a reaction component 88 and an adjacent moving component 90 that interacts with the reaction component 88. In the embodiment provided in FIGS. 1–5B, for each of the movers 81A, 81B, 83A, 83B, 84, 86, one of the components 88, 90 includes one or more magnet arrays and the other component 88, 90 includes one or more conductor arrays.

Each magnet array includes one or more magnets. The design of each magnet array and the number of magnets in each magnet array can be varied to suit the design requirements of the movers 81A, 81B, 83A, 83B, 84, 86. Each magnet can be made of a magnetic material such as NdFeB.

Each conductor array includes one or more conductors (not shown). The design of each conductor array and the number of conductors in each conductor array is varied to suit the design requirements of the movers 81A, 81B, 83A, 83B, 84, 86. Each conductor can be made of metal such as copper or any substance or material responsive to electrical current and capable of creating a magnetic field such as superconductors.

Electrical current (not shown) is supplied to the conductor(s) in each conductor array by the control system 22. For each mover 81A, 81B, 83A, 83B, 84, 86, the electrical current in the conductor(s) interact with the magnetic field(s) generated by the one or more of the magnets in the magnet array. This causes a force (Lorentz force) between the conductors and the magnets that can be used to move the respective stage 14, 16 relative to the stage base 12.

Specifically, for each stage 14, 16, the reaction component 88 and the moving component 90 of each X mover 81A, 81B, 83A, 83B interact to selectively move the respective stage 14, 16 along the X axis and about the Z axis relative to the stage base 12. In the embodiment illustrated in the FIGS. 1–4, each X mover 81A, 81B, 83A, 83B of each stage 14, 16, is a commutated, linear motor. In this embodiment, the reaction component 88 of each X mover 81A, 81B, 83A, 83B includes a conductor array while the moving component 90 of each X mover 81A, 81B, 83A, 83B includes a pair of spaced apart magnet arrays. Alternately, for example, the reaction component 88 of each X mover 81A, 81B, 83A, 83B can include a pair of spaced apart magnet arrays while the moving component 90 of each X mover 81A, 81B, 83A, 83B can include a conductor array.

For the first stage 14, the reaction component 88 for the left first X mover 81A is secured to a left first reaction frame 92A of the reaction mounting assembly 19 while the moving component 90 of the left first X mover 81A is secured to the first guide end 74 of the guide assembly 50. Similarly, for the first stage 14, the reaction component 88 for the right first X mover 81B is secured to a right first reaction frame 92B of the reaction mounting assembly 19 while the moving component 90 of the right first X mover 81B is secured to the second guide end 76 of the guide assembly 50.

For the second stage 16, the reaction component 88 for the left second X mover 83A is secured to a left second reaction frame 94A of the reaction mounting assembly 19 while the moving component 90 of the left second X mover 83A is secured to the first guide end 74 of the guide assembly 50. Similarly, for the second stage 16, the reaction component 88 for the right second X mover 83B is secured to a right second reaction frame 94B of the reaction mounting assembly 19 while the moving component 90 of the right second X mover 83B is secured to the second guide end 76 of the guide assembly 50.

Importantly, it should be noted that the reaction component 88 of the left first X mover 81A for the first stage 14 is secured to the left first reaction frame 92A and the reaction component 88 of the left second X mover 83A for the second stage 16 is secured to the left second reaction frame 94A. Similarly, the reaction component 88 of the right first X mover 81B for the first stage 14 is secured to the right first reaction frame 92B and the reaction component 88 of the right second X mover 83B for the second stage 16 is secured to the right second reaction frame 94B. With this design, the reaction forces generated by the first X movers 81A, 81B of the first stage 14 is uncoupled from the second stage 16. Further, the reaction forces generated by the second X movers 83A, 83B of the second stage 16 is uncoupled from the first stage 14. Stated another way, the first X movers 81A, 81B are uncoupled from the second X movers 83A, 83B. This feature minimizes and reduces the amount of reaction forces and disturbances that are transferred between the stages 14, 16.

Preferably, the X movers 81A, 81B, 83A, 83B for each stage 14, 16 push through a center of gravity 100 of each respective stage 14, 16. In the embodiment illustrated in FIGS. 1–4, for the first stage 14, the left first X mover 81A is positioned a predetermined distance below the center of gravity 100 of the first stage 14 and the right first X mover 81B is positioned an equal, predetermined distance above the center of gravity 100 of the first stage 14. With this design, the first X movers 81A, 81B push through a center of gravity 100 of the first stage 14. Similarly, for the second stage 16, the left second X mover 83A is positioned a predetermined distance above the center of gravity 100 of the second stage 16 and the right second X mover 83B is positioned a equal, predetermined distance below the center of gravity 100 of the second stage 16. With this design, the second X movers 83A, 83B push through a center of gravity 100 of the second stage 16.

Importantly, in the embodiment illustrated in FIGS. 1–4, the left first X mover 81A of the first stage 14 is positioned lower than and substantially parallel with the left second X mover 83A of the second stage 16. Further, the right first X mover 81B of the first stage 14 is positioned higher than and substantially parallel with the right second X mover 83B of the second stage 16. As a result of this design, the X movers 81A, 81B, 83A, 83B for each stage 14, 16 can independently move the respective stage 14, 16 into and out of the operational area 25. In this design, the device stage 48 of the first stage 14 and the device stage 48 of the second stage 18 are positioned at approximately the same height in the z direction.

With the design provided herein, for each of the stages 14, 16, the X movers 81A, 81B, 83A, 83B make relatively large displacement adjustments to the position of the guide assembly 50 along the X axis. The required stroke of the X movers 81A, 81B, 83A, 83B along the X axis will vary according to desired use of the stage assembly 10. For an exposure apparatus 30, generally, the stroke of the X movers 81A, 81B, 83A, 83B for moving the semiconductor wafer 28 is between approximately two hundred (200) millimeters and one thousand (1000) millimeters.

The X movers 81A, 81B, 83A, 83B preferably also make relatively slight adjustments to the position of each stage 14,

16 about the Z axis. In order to make the adjustments about the Z axis, for each stage 14, 16, the moving component 90 of one of the X movers 81A, 81B, 83A, 83B is moved relative to the moving component 90 of the other X mover 81A, 81B, 83A, 83B. With this design, the X movers 81A, 81B, 83A, 83B generate torque about the Z axis. A gap (not shown) exists between the reaction component 88 and the moving component 90 of each X mover 81A, 81B, 83A, 83B to allow for slight movement of each stage 14, 16 about the Z axis. Typically, the gap is between approximately one millimeter and five millimeters. However, depending upon the design of the particular mover, a larger or smaller gap may be utilized.

For each of the stages 14, 16, the Y guide mover 84 selectively moves the guide assembly 50 along the Y axis relative to the stage base 12. In the embodiment illustrated in FIGS. 1–4, the Y guide mover 84 of each stage 14, 16, is a voice coil motor. In this embodiment, (i) the moving component 90 of each Y guide mover 84 includes a conductor array that is secured to the guide assembly 50, and (ii) the reaction component 88 of each Y guide mover 84 includes a pair of spaced apart magnet arrays. For the first mover assembly 15, (i) the reaction component 88 of the Y guide mover 84 is secured to the left first reaction frame 92A above the reaction component 88 of the left first X mover 81A and (ii) the moving component 90 of the Y guide mover 84 is secured to the first guide end 74 of the guide assembly 50 above the moving component 90 of the left first X mover 81A. Alternately, for the second mover assembly 18, (i) the reaction component 88 of the Y guide mover 84 is secured to the right second reaction frame 94B, above the reaction component 88 of the right second X mover 83B and (ii) the moving component 90 of the Y guide mover 84 is secured to the second guide end 76 of the guide assembly 50 above the moving component 90 of the right second X mover 83B.

Importantly, it should be noted that the reaction component 88 of the Y guide mover 84 for the first stage 14 is secured to the left first reaction frame 92A and the reaction component 88 of the Y guide mover 84 for the second stage 16 is secured to the right second reaction frame 94B. With this design, the reaction forces generated by the Y guide mover 84 of the mover assembly 15 are uncoupled from the second stage 16 and the reaction forces generated by the Y guide mover 84 of the second mover assembly 18 are uncoupled from the first stage 14. Additionally, with this design, the reaction forces generated by the Y stage mover 86 of the first mover assembly 15 are uncoupled from the second stage 16 and the reaction forces generated by the Y stage mover 86 of the second mover assembly 18 are uncoupled from the first stage 14. Stated another way, the Y movers 84, 86 of the first mover assembly 15 are uncoupled from the Y movers 84, 86 of the second mover assembly 18. This feature minimizes and reduces the amount of reaction forces and disturbances that are transferred between the stages 14, 16.

Figure 3:
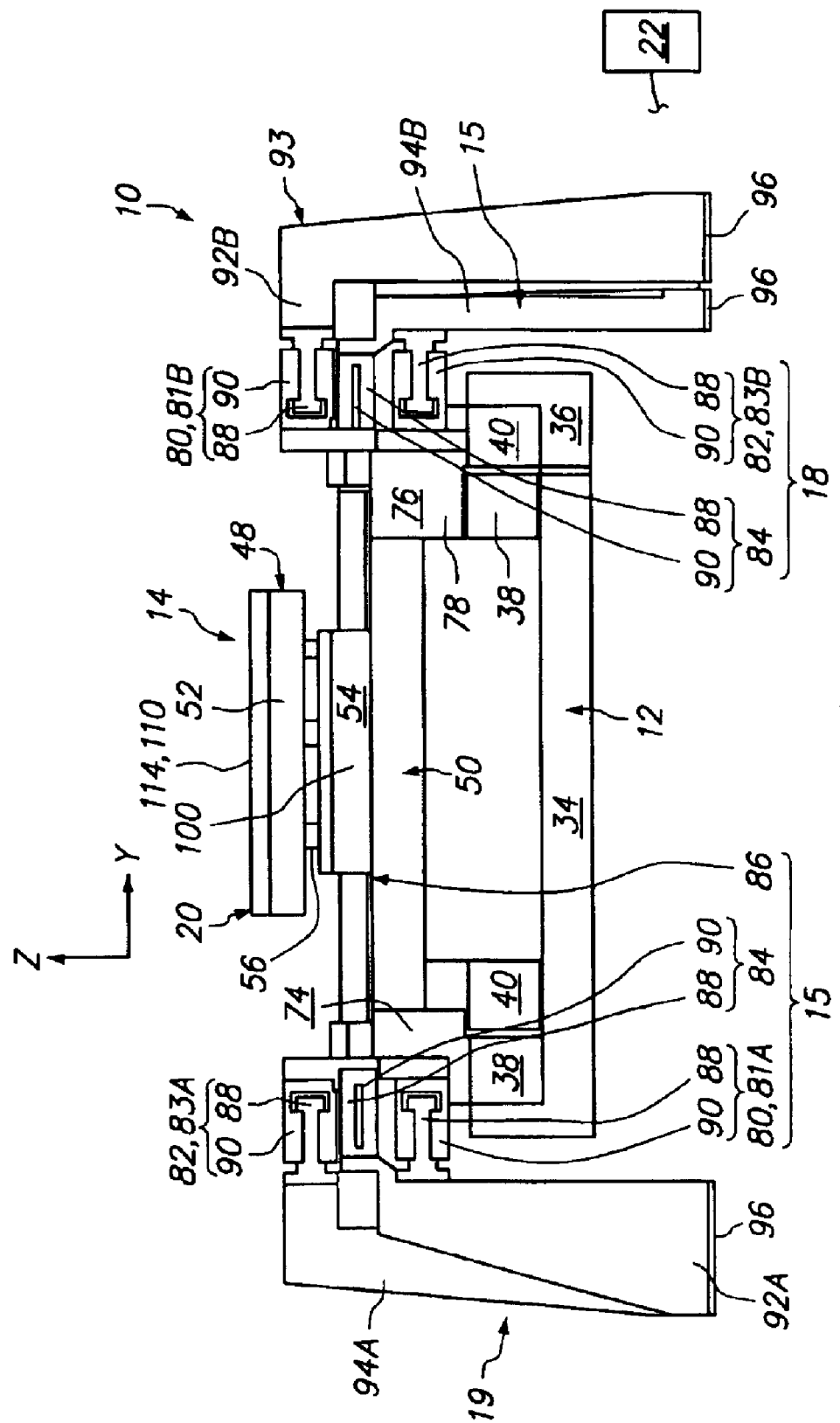
FIG. 3 is a front plan view of the stage assembly of FIG. 1.

Further, as can best be seen with reference to FIG. 3, because the first X movers 81A, 81B are staggered, the Y guide mover 84 of the first mover assembly 15 can be positioned to push through the center of gravity 100 of the first stage 14. A similar arrangement is also possible with the second stage 16.

The Y stage mover 86 of each mover assembly 15, 18 moves the respective stage 14, 16 with a relatively large displacement along the Y axis relative to the stage base 12. More specifically, for each stage 14, 16, the reaction component (not shown) and the moving component (not shown) of the Y stage mover 86 interact to selectively move the device table 48 along the Y axis relative to the guide assembly 50. In the embodiment illustrated in the FIGS. 1–4, each Y stage mover 86 is a commutated, linear motor. For each stage 14, 16, the reaction component for the Y stage mover 86 extends between the guide ends 74, 76 and moves with the guide assembly 50, and the moving component is secured to the lower table component 54 of the device table 48, near the mover opening 66. In this embodiment, the reaction component of the Y stage mover 86 includes a conductor array and the moving component of the Y stage mover 86 includes a magnet array. Alternately, for example, the reaction component of the Y stage mover 86 could include a magnet array while the moving component of the Y stage mover 86 could include a conductor array.

With this design, for each stage 14, 16, the Y stage mover 86 makes relatively large displacement adjustments to the position of the device table 48 along the Y axis. The required stroke of the Y stage mover 86 along the Y axis will vary according to desired use of the stage assembly 10. More specifically, for an exposure apparatus 30, generally, the stroke of the Y stage mover 86 for moving the semiconductor wafer 28 is between approximately one hundred (100) millimeters and six hundred (600) millimeters.

The reaction mounting assembly 19 preferably reduces and minimizes the amount of reaction forces from the movers 81 A, 81B, 83A, 83B, 84, 86 of each stage mover assembly 15, 18 that is transferred to the stage base 12 and transferred between the stages 14, 16. The design of the reaction mounting assembly 19 can be varied to suit the design requirements of the stage assembly 10. In the embodiment illustrated in FIGS. 1–4, the reaction mounting assembly 19 includes the left first reaction frame 92A, the right first reaction frame 92B, the left second reaction frame 94A, and the right second reaction frame 94B. In this design each of the frames 92A, 92B, 94A and 94B is a bracket having an inverted "L" shaped cross section. The first reaction frames 92A, 92B cooperate to define a first reaction frame assembly 93 and the second reaction frames 94A, 94B cooperate to define a second reaction frame assembly 95.

Referring to FIG. 12, each of the frames 92A–94B is preferably, independently secured to the mounting base 24. With this design, the reaction forces generated by the movers 81A, 81B, 84, 86 of the first mover assembly 15 are uncoupled from the second stage 16. Further, the reaction forces generated by the movers 83A, 83B, 84, 86 of the second mover assembly 18 are uncoupled from the first stage 14. Stated another way, the movers 81A, 81B, 84, 86 that move the first stage 14 are uncoupled from the movers 83A, 83B, 84, 86 that move the second stage 16. This feature minimizes and reduces the amount of reaction forces and disturbances that are transferred between the stages 14, 16.

In summary, when the first mover assembly 15 applies a force to move the first stage 14 along the X axis, the Y axis, and/or about the Z axis, an equal and opposite first reaction force is applied to the first reaction frames 92A, 92B and the mounting base 24. Similarly, when the second mover assembly 18 applies a force to move the second stage 16 along the X axis, the Y axis, and/or about the Z axis, an equal and opposite second reaction force is applied to the second reaction frames 94A, 94B and the mounting base 24. With this design, the first reaction forces and the second reaction forces are independently transferred to the mounting base 24.

Preferably, each of the reaction frames 92A, 92B, 94A, 94B are secured with a reaction frame dampener 96 to the mounting base 24. Each reaction frame dampener 96 can be made of a resilient, flexible material with good damping properties. A suitable material is ultra-pure viscoelastic damping polymer made by 3M Corporation in Minneapolis, Minn. Alternately, for example, each of the reaction frame dampeners 96 can include a pneumatic cylinder and one or more actuators.

Alternately, the reaction mounting assembly 19 could be designed to include one or more reaction masses (not shown) for each of the reaction frames 92A–94B. A suitable reaction mass type assembly is illustrated in FIGS. 6 and 7 and described below. This design allows the reaction mounting assembly to reduce and minimize the amount of reaction forces from the mover assemblies 15, 18 that are transferred to the mounting base 24.

The measurement system 20 monitors movement of each stage 14, 16 relative to the stage base 12, or to some other reference such as the optical assembly 200 (illustrated in FIG. 12). With this information, the mover assemblies 15, 18 can be used to precisely position the stages 14, 16. The design of the measurement system 20 can be varied. For example, the measurement system 20 can utilize laser interferometers, encoders, and/or other measuring devices to monitor the position of the stages 14,16.

In the embodiment illustrated in FIGS. 1–4, the measurement system 20 monitors the position of the device table 48 for each stage 14, 16 along the X axis, along the Y axis, and about the Z axis. For the design illustrated in FIGS. 1–4, for each stage 14, 16, the measurement system 20 measures the position of the device table 48 relative to the guide assembly 50 along the Y axis, and the measurement system 20 measures the position of the device table 48 along the Y axis, along the X axis, and about the Z axis relative to the optical assembly 200 (illustrated in FIG. 12).

In this embodiment, for each stage 14, 16, the measurement system 20 utilizes a linear encoder (not shown) that measures the amount of movement of device table 48 relative to the guide assembly 50 as the device table 48 moves relative to the guide assembly 50. Alternately, for example, an interferometer system (not shown) can be utilized. A suitable interferometer system can be made with components obtained from Agilent Technologies in Palo Alto, Calif.

Figure 4:
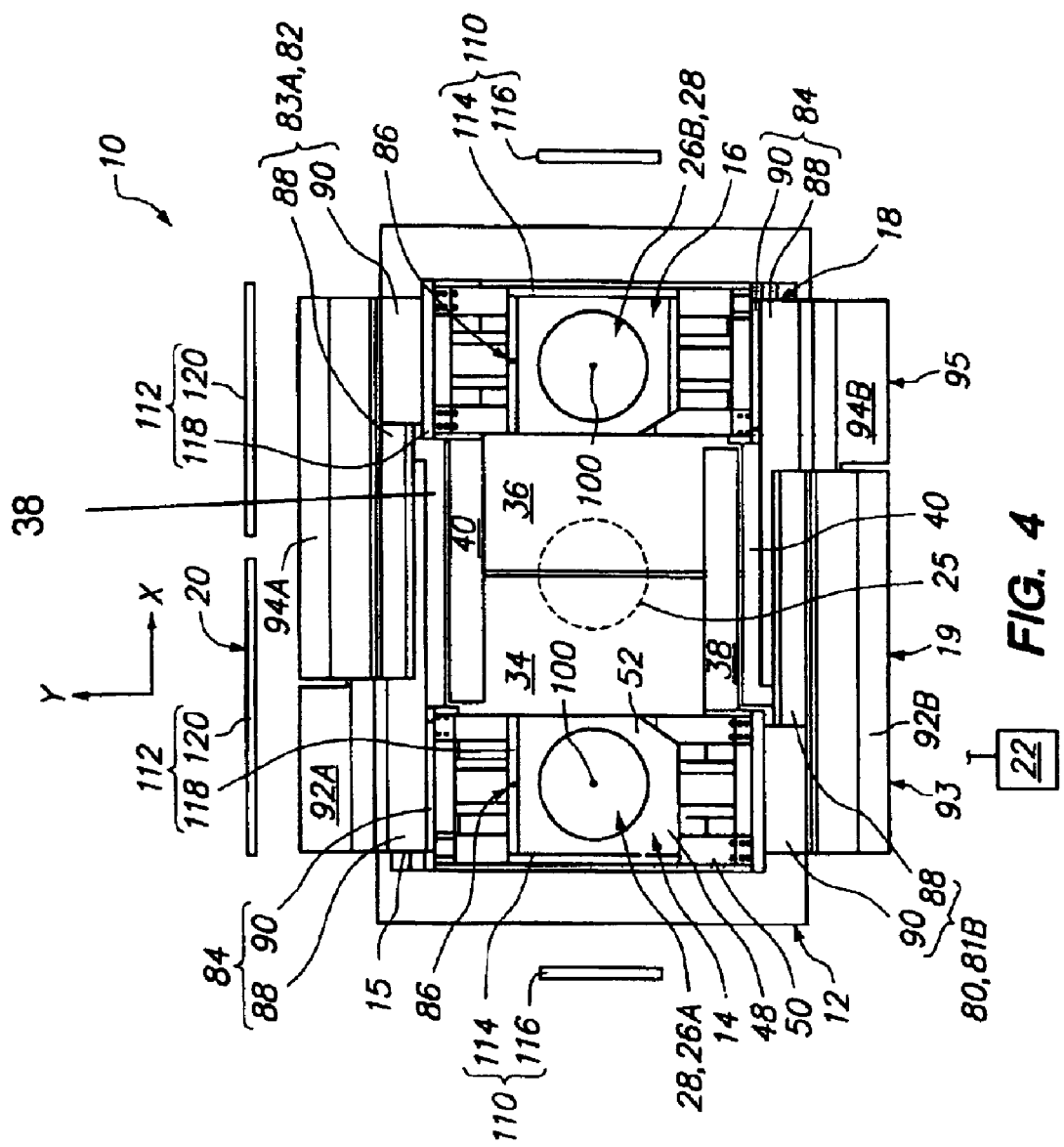
FIG. 4 is a top plan view of the stage assembly of FIG. 1.

Additionally, as illustrated in FIG. 4, for each stage 14, 16, the measurement system 20 includes an XZ interferometer 110 and a Y interferometer 112. The XZ interferometer 110 includes an XZ mirror 114 and an XZ block 116. The XZ block 116 interacts with the XZ mirror 114 to monitor the location of the device table 48 along the X axis and about the Z axis (theta Z) for each stage 14, 16. More specifically, the XZ block 116 generates a pair of spaced apart XZ measurement beams (not shown) that are reflected off of the XZ mirror 114. With these beams, the location of the device table 48 along the X axis and about the Z axis can be monitored for each stage 14, 16. Further, because the device table 48 does not move relative to the guide assembly 50 along the X axis or about the Z axis, the location of the guide assembly 50 along the X axis and about the Z axis can also be monitored by the XZ interferometer 110 for each stage 14, 16.

In the embodiment illustrated in the Figures, the XZ mirror 114 is rectangular shaped and extends along one side of the device table 48. The XZ block 116 is positioned away from the device table 48. The XZ block 116 can be secured to an apparatus frame 202 (illustrated in FIG. 12) or some other location that is isolated from vibration.

Somewhat similarly, the Y interferometer 112 includes a Y mirror 118 and a Y block 120. The Y mirror 118 interacts with the Y block 120 to monitor the position of the device table 48 along the Y axis for each stage 14, 16. More specifically, the Y block 120 generates a Y measurement beam that is reflected off of the Y mirror 118. With this beam, the location of the device table 48 along the Y axis can be monitored for each stage 14, 16. Further, because the position of the device table 48 relative to the guide assembly 50 along the Y axis is measured with the encoder, the position of the guide assembly 50 along the Y axis can also be monitored for each stage 14, 16.

In the embodiment illustrated in the Figures, the Y mirror 118 is rectangular shaped and is positioned along one of the sides of the device table 48. The Y block 120 is positioned away from the device table 48. The Y block 120 can be secured to the apparatus frame 202 (illustrated in FIG. 12) or some other location that is isolated from vibration.

Additionally, the measurement system 20 can include one or more sensors (not shown) that measure the position of the upper table component 52 relative to the lower table component 54.

The control system 22 controls the mover assemblies 15, 18 to precisely position the stages 14, 16 and the devices 26A, 26B. In the embodiment illustrated in FIGS. 1–4, the control system 22 directs and controls the current to the conductor array(s) for each of the movers 81A, 81B, 83A, 83B, 84, 86 and the table mover assembly 56 to control movement of the stages 14, 16 along the X axis, the Y axis and the Z axis and about the X axis, the Y axis and the Z axis.

FIGS. 6 and 7 illustrate a second embodiment of a stage assembly 10 having features of the present invention. The stage assembly 10 illustrated in FIGS. 6 and 7 includes the stage base 12, the first stage 14, the first mover assembly 15, the second stage 16, the second mover assembly 18, and the reaction mounting assembly 19. Only a portion of the measurement system 20 is illustrated in FIGS. 6 and 7. The control system is not illustrated in FIGS. 6 and 7.

In the embodiment illustrated in FIGS. 6 and 7, each of the stages 14, 16, the first mover assembly 15, the second mover assembly 18, the reaction mounting assembly 19 and the measurement system 20 are somewhat similar to the equivalent components described above and illustrated in FIGS. 1–4. Accordingly, only the particularly relevant differences are described below.

In the embodiment illustrated in FIGS. 6 and 7, a single stage base 12 supports each stage 14, 16 and a vacuum preload type, fluid bearing that allows each stage 14, 16 to move independently relative to the stage base 12 along the X axis, along the Y axis and about the Z axis. Further, the first mover assembly 15 again controls and moves the first stage 14 relative to the stage base 12 and the second mover assembly 18 controls and moves the second stage 16 relative to the stage base 12.

In FIGS. 6 and 7, (i) the first mover assembly 15 again includes the first X mover system 80 having the left first X mover 81A and the right first X mover 81B, and (ii) the second mover assembly 18 includes the second X mover system 82 having the left second X mover 83A and the right second X mover 83B. Further, each of the mover assemblies 15, 18 includes the Y guide mover 84 and the Y stage mover 86.

In the embodiment illustrated in the FIGS. 6 and 7, each X mover 81A, 81B, 83A, 83B for each stage 14, 16, is again a commutated, linear motor. In this embodiment, the reaction component 88 of each X mover 81A, 81B, 83A, 83B includes a conductor array while the moving component 90 of each X mover 81A, 81B, 83A, 83B includes a pair of spaced apart magnet arrays. Alternately, for example, the reaction component 88 of each X mover 81A, 81B, 83A, 83B can include a magnet array while the moving component 90 of each X mover 81A, 81B, 83A, 83B can include a pair of spaced apart conductor arrays.

For the first stage 14, the reaction component 88 for the left first X mover 81A is secured to the left first reaction frame 92A of the reaction mounting assembly 19 while the moving component 90 of the left first X mover 81A is secured with a left first support bracket 122A to the first guide end 74 of the guide assembly 50. Similarly, for the first stage 14, the reaction component 88 for the right first X mover 81B is secured to the right first reaction frame 92B of the reaction mounting assembly 19 while the moving component 90 of the right first X mover 81B is secured with a right first support bracket 122B to the second guide end 76 of the guide assembly 50.

For the second stage 16, the reaction component 88 for the left second X mover 83A is secured to the left second reaction frame 94A of the reaction mounting assembly 19 while the moving component 90 of the left second X mover 83A is secured with a left second support bracket 124A to the first guide end 74 of the guide assembly 50. Similarly, for the second stage 16, the reaction component 88 for the right second X mover 83B is secured to the right second reaction frame 94B of the reaction mounting assembly 19 while the moving component 90 of the right second X mover 83B is secured with a right second support bracket 124B to the second guide end 76 of the guide assembly 50.

Importantly, it should be noted that the reaction component 88 of the left first X mover 81A for the first stage 14 is secured to the left first reaction frame 92A and the reaction component 88 of the left second X mover 83A for the second stage 16 is secured to the left second reaction frame 94A. Similarly, the reaction component 88 of the right first X mover 81B for the first stage 14 is secured to the right first reaction frame 92B and the reaction component 88 of the right second X mover 83B for the second stage 16 is secured to the right second reaction frame 94B. With this design, the reaction forces generated by the first X movers 81A, 81B are uncoupled from the second stage 16. Further, the reaction forces generated by the second X movers 83A, 83B are uncoupled from the first stage 14. Stated another way, the first X movers 81A, 81B of the first stage 14 are uncoupled from the second X movers 83A, 83B. This feature minimizes and reduces the amount of reaction forces and disturbances that are transferred between the stages 14, 16.

In FIGS. 6 and 7, each of the reaction frames 92A, 92B, 94A, 94B is supported above and free to move relative to a separate reaction plate 98. In this embodiment, each reaction plate 98 is secured to the mounting base (not shown in FIGS. 6 and 7). Further, each of the reaction frames 92A, 92B, 94A, 94B is supported above one of the reaction plates 98 with a vacuum type fluid bearing (not shown). This design allows each of the reaction frames 92A, 92B, 94A, 94B to move relative to the respective reaction plates 98 along the X axis, along the Y axis and about the Z axis. Stated another way, each reaction frame 92A, 92B, 94A, 94B is free to move relative to the mounting base 24 with at least one degree of freedom and more preferably three degrees of freedom.

With this design, through the principle of conservation of momentum, movement of each stage 14, 16 by the respective mover assembly 15, 18 in one direction results in movement of the respective reaction frame 92A, 92B, 94A, 94B in the opposite direction relative to the reaction plates 98. This inhibits coupling of the reaction forces between the stages 14, 16 and minimizes the amount of reaction forces from the mover assemblies that are transferred to the mounting base 24. Further, with this design, one or more reaction movers (not shown) can be used to correct the position of the reaction frames 92A, 92B, 94A, 94B relative to the reaction plates 98.

Alternately, for example, the reaction frames 92A, 92B, 94A, 94B can be supported away from the respective reaction plate 98 by magnetic type bearings or a ball bearing type assembly. Still alternately, each of the reaction frames 92A, 92B, 94A, 94B can be secured to the mounting base 24 with a reaction frame dampener.

Preferably, the X movers 81A, 81B, 83A, 83B for each stage 14, 16 push through a center of gravity 100 of each respective stage 14, 16. In the embodiment illustrated in FIGS. 6 and 7, for the first stage 14, the first X movers 81A, 81B are positioned at approximately the same height as the center of gravity 100 of the first stage 14. With this design, the first X movers 81A, 81B of the first stage 14 push through the center of gravity 100 of the first stage 14. Similarly, for the second stage 16, the second X movers 83A, 83B are positioned at approximately the same height as the center of gravity 100 of the second stage 16. With this design, the second X movers 83A, 83B push through a center of gravity 100 of the second stage 16.

Also, in the embodiment illustrated in FIGS. 6 and 7, the left first X mover 81A is positioned between the second X movers 83A, 83B. Further, the right second X mover 83B is positioned between the first X movers 81A, 81B. As a result of this staggered design, the X movers 81A, 81B, 83A, 83B for each stage 14, 16 can move the respective stage 14, 16 and the respective device 26A, 26B into and out of the operational area 25.

The design of each Y guide mover 84 in FIGS. 6 and 7 is also slightly different than the Y guide mover 84 described above and illustrated in FIGS. 1–4. In particular, in FIGS. 6 and 7, each Y guide mover 84 of each stage 14, 16, includes an opposed pair of electromagnetic actuators 126.

Figure 8A:
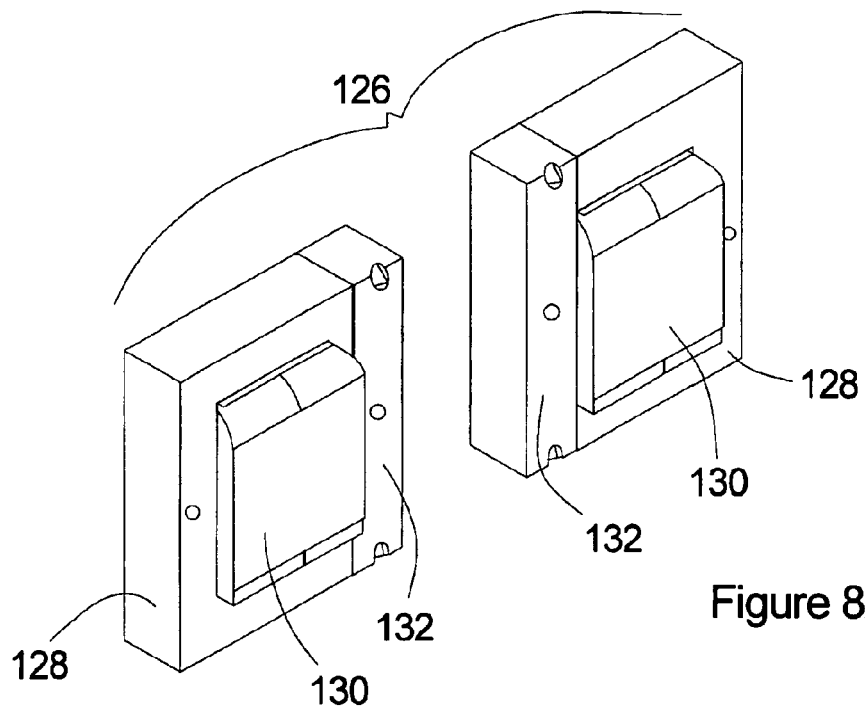
FIG. 8A is a perspective view of an actuator having features of the present invention.
Figure 8B:
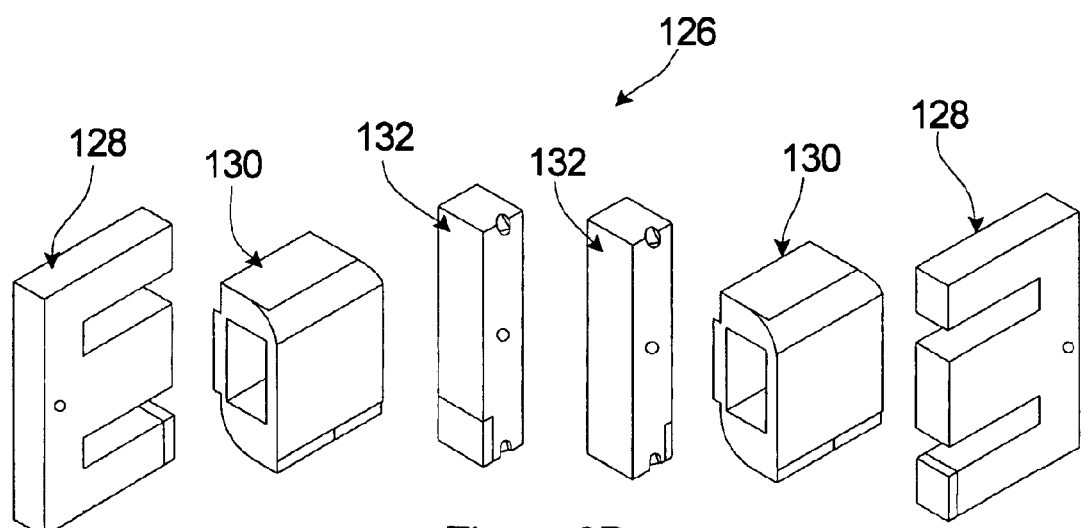
FIG. 8B is an exploded perspective view of the actuator of FIG. 8A.

FIGS. 8A and 8B illustrate a perspective view of a preferred pair of electromagnetic actuators 126. More specifically, FIG. 8A illustrates a perspective view of a pair of electromagnetic actuators 126 commonly referred to as E/I core actuators, and FIG. 8B illustrates an exploded perspective view of the E/I core actuators. Each E/I core actuator is essentially an electromagnetic attractive device and includes an E shaped core 128, a tubular conductor 130, and an I shaped core 132. The E shaped core 128 and the I shaped core 132 are each made of a magnetic material such as iron, silicon steel, or Ni—Fe steel. The tubular conductor 130 is positioned around the center bar of the E shaped core 128.

In the embodiment illustrated in FIGS. 6 and 7, the Y guide mover 84 for the first mover assembly 15 includes (i) a pair of spaced apart, E shaped core 128 and tubular conductor 130 combinations that are secured to the left first support bracket 122A and the first guide end 74 of the guide assembly of the first stage 14 and (ii) a pair of spaced apart rows of I shaped cores 132 that are secured to the left first reaction frame 92A. Similarly, the Y guide mover 84 for the second mover assembly 18 includes (i) a pair of spaced apart, E shaped core 128 and tubular conductor 130 combinations that are secured to the right second support bracket 124B and the second guide end 76 of the guide assembly of the second stage 16 and (ii) a pair of spaced apart rows of I shaped cores 132 that are secured to the right second reaction frame 94B.

Further, (i) the moving component 90 of the left first X mover 81A is secured to the left first support bracket 122A positioned between the E shaped core 128 and tubular conductor 130 combinations and (ii) the reaction component 88 of the left first X mover 81A is secured to the left first reaction frame 92A between the rows of I shaped cores 132. Similarly, (i) the moving component 90 of the right second X mover 83B is secured to the right second support bracket 124B positioned between the E shaped core 128 and tubular conductor 130 combinations and (ii) the reaction component 88 of the right second X mover 83B is secured to the right second reaction frame 94B between the rows of I shaped cores 132. Stated another way, (i) the left first X mover 81A is positioned between the Y guide mover 84 of the first mover assembly 15 and (ii) the right second X mover 83B is positioned between the Y guide mover 84 of the second mover assembly 18.

Importantly, it should be noted that the rows of I shaped cores 132 of the Y guide mover 84 for the first mover assembly 15 is secured to the left first reaction frame 92A and the rows of I shaped cores 132 of the Y guide mover 84 for the second mover assembly 18 is secured to the right second reaction frame 94B. With this design, the reaction forces generated by the Y movers 84, 86 of the first mover assembly 15 are uncoupled from the second stage 16. Further, the reaction forces generated by the Y mover 84, 86 of the second mover assembly 18 are uncoupled from the first stage 14.

In the embodiment illustrated in FIGS. 6 and 7, the reaction mounting assembly 19 again includes the left first reaction frame 92A, the right first reaction frame 92B, the left second reaction frame 94A, and the right second reaction frame 94B. Preferably, each of the frames 92A–94B is independently secured to the mounting base 24.

FIG. 9 illustrates a third embodiment of a stage assembly 10 having features of the present invention. The stage assembly 10 illustrated in FIG. 9 includes the stage base 12, the first stage 14, the first mover assembly 15, the second stage 16, the second mover assembly 18, and the reaction mounting assembly 19. Only a portion of the measurement system 20 is illustrated in FIG. 9. The control system is not illustrated in FIG. 9.

In the embodiment illustrated in FIG. 9, each of the stages 14, 16, the first mover assembly 15, the second mover assembly 18, the reaction mounting assembly 19 and the measurement system 20 are somewhat similar to the equivalent components described above and illustrated in FIGS. 1–4. Accordingly, only the particularly relevant differences are described below.

In FIG. 9, a single stage base 12 supports each stage 14,16 and a vacuum preload type, fluid bearing allows each stage 14, 16 to move independently relative to the stage base 12 along the X axis, along the Y axis and about the Z axis. Further, the first mover assembly 15 again controls and moves the first stage 14 relative to the stage base 12 and the second mover assembly 18 controls and moves the second stage 16 relative to the stage base 12.

In FIG. 9, (i) the first mover assembly 15 again includes the first X mover system 80 having the left first X mover 81A and the right first X mover 81B, and (ii) the second mover assembly 18 includes the second X mover system 82 having the left second X mover 83A and the right second X mover 83B. Further, each of the mover assemblies 15, 18 includes the Y guide mover 84 and the Y stage mover 86.

In the embodiment illustrated in the FIG. 9, each X mover 81A, 81B, 83A, 83B for each mover assembly 15, 18, is again a commutated, linear motor. In this embodiment, (i) the left first X mover 81A and the left second X mover 83A share a left common reaction component 140 and (ii) the right first X mover 81B and the right second X mover 83B share a right common reaction component 142.

Further, each of the left X movers 81A, 83A includes a separate moving component 90 that interacts with the left common reaction component 140 and each of the right X movers 81B, 83B includes a separate moving component 90 that interacts with the right common reaction component 142. More specifically, (i) the moving component 90 of the left first X mover 81A is secured to the first guide end 74 of the first stage 14, (ii) the moving component 90 of the left second X mover 83A is secured to the first guide end 74 of the second stage 16, (iii) the moving component 90 of the right first X mover 81B is secured to the second guide end 76 of the first stage 14, and (iv) the moving component 90 of the right second X mover 83B is secured to the second guide end 76 of the second stage 16.

In the embodiment illustrated in FIG. 9, each common reaction component 140, 142 includes an upper magnet array 150 and a lower magnet array 152 and each moving component 90 includes a conductor array. Alternately, for example, the each common reaction component 140, 142 can include one or more conductor arrays and each moving component can include one or more magnet arrays.

Uniquely, the left common reaction component 140 includes a plurality of spaced apart left component segments 146 and the right common reaction component 142 includes a plurality of spaced apart right component segments 148. Each of the component segments 146, 148 is separated by a segment gap 149. As a result of this design, the stages 14, 16 are not interacting with the same component segments 146, 148 at the same time. Stated anther way, at any given time, the first X movers 81A, 81B are interacting with different component segments 146, 148 than the second X movers 83A, 83B. Thus, the multiple component segments 146, 148 minimize the amount of reaction forces and disturbances that are transferred between the stages 14, 16.

The number and size of each of the component segments 146, 148 can be varied. In the embodiment illustrated in FIG. 9, each of the common reaction component 140, 142 includes eight spaced apart component segments 146, 148. Alternately, each of the common reaction components 140, 142 can include more than eight or less than eight component segments 146, 148. Preferably, the component segments 146, 148 are sized and positioned so that when one of the stages 14, 16 is in the operational area 25, the first X mover system 80 is not interacting with the same component segments 146, 148 as the second X mover system 82.

The size of each segment gap 149 between adjacent segments 146, 148 can be varied. The segment gap 149 must be large enough to allow for motion of adjacent segments 146, 148 relative to each other but small enough to minimize disturbances in magnetic flux. Preferably, the segment gap 149 is between approximately 0.5 mm and 5 mm. Alternately, larger or smaller segment gaps 149 can be utilized.

Figure 10:
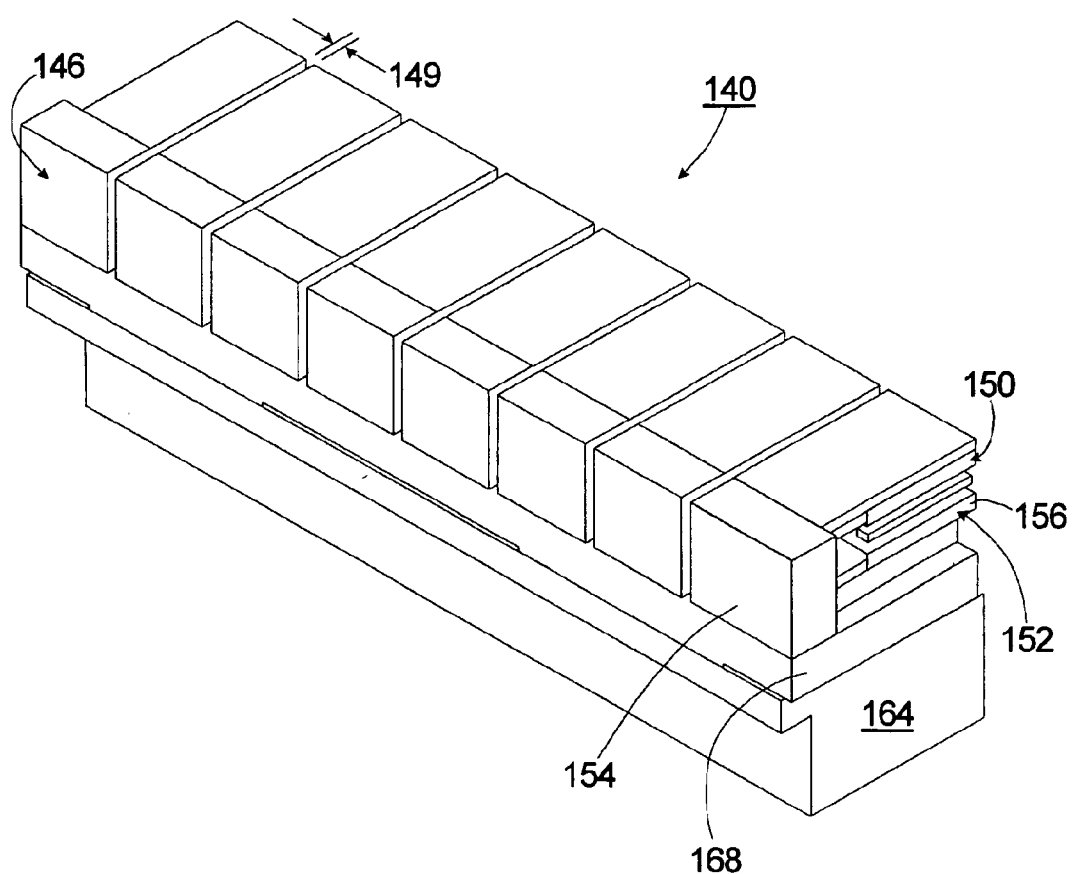
FIG. 10 is a perspective view of a left common reaction component having features of the present invention.
Figure 11:
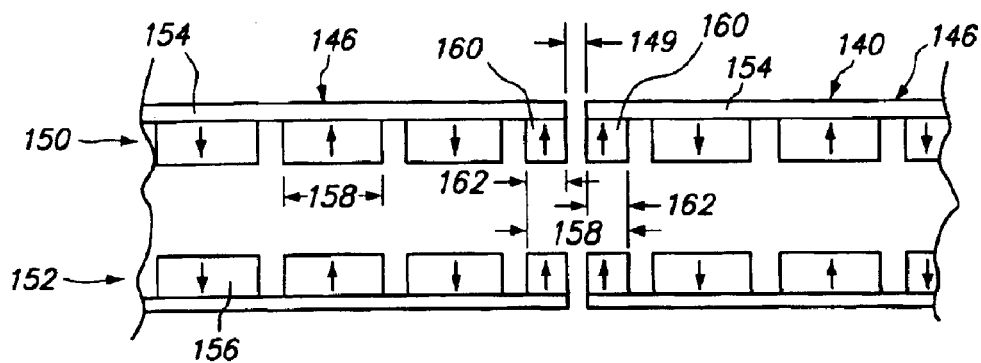
FIG. 11 is a front plan view of a portion of the left common reaction component and the left common reaction frame of FIG. 10.

FIG. 10 illustrates a perspective view of the left common reaction component 140 and FIG. 11 illustrates a front plan of a portion of the left common reaction component 140. The right common reaction component 142 is designed similarly to the left common reaction component 140. Accordingly, only the left common reaction component 140 is described below. In FIG. 11, the arrows illustrate magnet polarity and point from the South pole to the North pole.

In this embodiment, left common reaction component 140 includes the upper magnet array 150, the spaced apart lower magnet array 152, and a plurality of spaced apart segment housings 154. Each segment housing 154 is somewhat "U" shaped. Each of the segment housings 154 retains a portion of the upper magnet array 150 spaced apart from a portion of the lower magnet array 152. Alternately, for example, the left common reaction component could be designed with a single magnet array, or one or more conductor arrays.

Each of the magnet arrays 150, 152 includes one or more magnets 156. The design, the positioning, and the number of magnets 156 in each magnet array 150, 152 can be varied. Preferably, each magnet array 150, 152 includes a plurality of rectangular shaped magnets 156 that are aligned side-by-side linearly. Each of the magnets 156 has a magnet width 158 (illustrated in FIG. 11). The magnets 156 in each magnet array 150, 152 are orientated so that the poles alternate between the North pole and the South pole. Stated another way, the magnets 156 in each magnet array 150, 152 are preferably arranged with alternating magnetic polarities. Further, the polarities of opposed magnets 156 in the two magnet arrays 150, 152 are opposite. This leads to strong magnetic fields in the region of the moving component 90.

Each of the magnets 156 is surrounded by a magnetic field of preferably equal magnitude. Further, each of the magnets 156 is preferably made of a high energy product, rare earth, permanent magnetic material such as NdFeB.

Preferably, the magnet arrays 150, 152 are separated in a manner that minimizes the disturbances in magnetic flux in the gap between the magnet arrays 150, 152. As illustrated in FIG. 11, the magnet arrays 150, 152 can be separated in the middle of a particular magnet 156 to form a pair of adjacent magnet pieces 160 having the same polarity that are separated by the segment gap 149. Each magnet piece 160 has a piece width 162. The magnet pieces 160 are attached to adjacent segment housings 154. Further, the magnet pieces 160 are sized, shaped and positioned so that the combined piece widths 162 of the adjacent magnet pieces 160 plus the segment gap 149 equals the magnet width 158 of one of the other magnets 156 in the magnet arrays 150, 152. With this design, the disturbances in the magnetic flux in the magnet arrays 150, 152 are minimized. Further, the disturbances can be compensated for by adjusting magnet flux density in the magnets 162 or current in the conductors in the moving component 90.

In the embodiment illustrated in FIG. 9, the reaction mounting assembly 19 includes a left common reaction frame 164 and a right common reaction frame 166. The left common reaction frame 164 secures the left component segments 146 of the left common reaction component 140 to the mounting base 24 (not shown in FIG. 9) and the right common reaction frame 166 secures the right component segments 148 of the right common reaction component 142 to the mounting base 24 (not shown in FIG. 9).

Preferably, the reaction mounting assembly 19 also includes a left flexible support assembly 168 and a right flexible support assembly 170. The left flexible support assembly 168 secures the left common reaction frame 164 to the left component segments 146 of the left common reaction component 140. The right flexible support assembly 170 secures the right common reaction frame 166 to the right component segments 148 of the right common reaction component 142.

The left flexible support assembly 168 attenuates movement of the left component segments 146 and allows for movement of left component segments 146 relative to each other. The right flexible support assembly 170 attenuates movement of the right component segments 148 and allows for movement of right component segments 148 relative to each other.

The design of the flexible support assemblies 166, 168 can be varied. In the embodiment provided herein, each flexible support assembly 166, 168 is a piece of resilient material such as ultra-pure viscoelastic dampening polymer made by 3M Corporation, located in Minneapolis, Minn. Alternately, for example, each of the flexible support assemblies 166, 168 can be made of any flexible material with good damping properties, constraint layer damping or squeeze film damping. Still alternately, each of the flexible support assemblies 166, 168 can include one or more shock absorbers, actuators and/or springs.

Importantly, the first X movers 81A, 81B are preferably positioned to push through the center of gravity 100 of the first stage 14 and the second X movers 83A, 83B are preferably positioned to push through the center of gravity 100 of the second stage 16. With the design illustrated in FIG. 9, the X movers 81A, 81B, 83A, 83B are positioned at the same level and each of the stages 14, 16 can be positioned in the operational area 25.

In FIG. 9, for each stage 14, 16, the Y guide mover 84 again selectively moves the guide assembly 50 along the Y axis relative to the stage base 12. In this embodiment, each Y guide mover 84 includes an opposed pair of electromagnetic actuators 126 similar to the actuators illustrated in FIGS. 8A and 8B and described above.

In FIG. 9, (i) the Y guide mover 84 of the first mover assembly 15 includes a pair of spaced apart, E shaped core 128 and tubular conductor 130 combinations that are secured to the right first support bracket 122B and (ii) the Y guide mover 84 for the second mover assembly 18 includes a pair of spaced apart, E shaped core 128 and tubular conductor 130 combinations that are secured to the right second support bracket 124B. Further, the Y guide mover 84 for each stage 14, 16 share a common row of I cores 172 that is secured to the right flexible support assembly 170.

Preferably, the common row of I cores 172 includes a plurality of spaced apart I segments 174. As a result of this design, the stages 14, 16 are not interacting with the same I segments 174 at the same time. Stated anther way, at any given time, the Y guide mover 84 of the first mover assembly 15 is interacting with different I segments 174 than the Y guide mover 84 of the second mover assembly 18. With this design, the reaction forces generated by the Y movers 84, 86 of the first mover assembly 15 are uncoupled from the second stage 16. Further, the reaction forces generated by the Y movers 84, 86 of the second mover assembly 18 are uncoupled from the first stage 14. Thus, the multiple I segments 174 minimize the amount of reaction forces and disturbances that are transferred between the stages 14, 16.

FIG. 12 is a schematic view illustrating an exposure apparatus 30 useful with the present invention. The exposure apparatus 30 includes the apparatus frame 202, an illumination system 204 (irradiation apparatus), a reticle stage assembly 206, the optical assembly 200 (lens assembly), and a wafer stage assembly 210. The stage assemblies 10 provided herein can be used as the wafer stage assembly 210. Alternately, with the disclosure provided herein, the stage assemblies 10 provided herein can be modified for use as the reticle stage assembly 206.

The exposure apparatus 30 is particularly useful as a lithographic device that transfers a pattern (not shown) of an integrated circuit from the reticle 32 onto the semiconductor wafer 28. The exposure apparatus 30 mounts to the mounting base 24, e.g., the ground, a base, or floor or some other supporting structure.

The apparatus frame 202 is rigid and supports the components of the exposure apparatus 30. The design of the apparatus frame 202 can be varied to suit the design requirements for the rest of the exposure apparatus 30. The apparatus frame 202 illustrated in FIG. 12 supports the optical assembly 200 and the illumination system 204 and the reticle stage assembly 206 above the mounting base 24.

The illumination system 200 includes an illumination source 212 and an illumination optical assembly 214. The illumination source 212 emits a beam (irradiation) of light energy. The illumination optical assembly 214 guides the beam of light energy from the illumination source 212 to the optical assembly 200. The beam illuminates selectively different portions of the reticle 32 and exposes the semiconductor wafer 28. In FIG. 12, the illumination source 212 is illustrated as being supported above the reticle stage assembly 206. Typically, however, the illumination source 212 is secured to one of the sides of the apparatus frame 202 and the energy beam from the illumination source 212 is directed to above the reticle stage assembly 206 with the illumination optical assembly 214.

The optical assembly 200 projects and/or focuses the light passing through the reticle to the wafer. Depending upon the design of the exposure apparatus 30, the optical assembly 200 can magnify or reduce the image illuminated on the reticle.

The reticle stage assembly 206 holds and positions the reticle relative to the optical assembly 200 and the wafer. Similarly, the wafer stage assembly 210 holds and positions the wafers with respect to the projected image of the illuminated portions of the reticle in the operational area. In FIG. 12, the wafer stage assembly 210 utilizes a stage assembly 10 having features of the present invention. Depending upon the design, the exposure apparatus 30 can also include additional motors to move the stage assemblies 206, 210.

There are a number of different types of lithographic devices. For example, the exposure apparatus 30 can be used as scanning type photolithography system that exposes the pattern from the reticle onto the wafer with the reticle and the wafer moving synchronously. In a scanning type lithographic device, the reticle is moved perpendicular to an optical axis of the optical assembly 200 by the reticle stage assembly 206 and the wafer is moved perpendicular to an optical axis of the optical assembly 200 by the wafer stage assembly 210. Scanning of the reticle and the wafer occurs while the reticle and the wafer are moving synchronously. In each embodiment, scanning direction can be set in y direction.

Alternately, the exposure apparatus 30 can be a step-and-repeat type photolithography system that exposes the reticle while the reticle and the wafer are stationary. In the step and repeat process, the wafer is in a constant position relative to the reticle and the optical assembly 200 during the exposure of an individual field.

Subsequently, between consecutive exposure steps, the wafer is consecutively moved by the wafer stage perpendicular to the optical axis of the optical assembly 200 so that the next field of the wafer is brought into position relative to the optical assembly 200 and the reticle for exposure. Following this process, the images on the reticle are sequentially exposed onto the fields of the wafer so that the next field of the wafer is brought into position relative to the optical assembly 200 and the reticle.

However, the use of the exposure apparatus 30 and the stage assembly 10 provided herein are not limited to a photolithography system for semiconductor manufacturing. The exposure apparatus 30, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, electric razors, machine tools, metal cutting machines, inspection machines and disk drives.

The illumination source 212 can be g-line (436 nm), i-line (365 nm), KrF excimer laser (248 nm), ArF excimer laser (193 nm) and $F_2$ laser (157 nm).

Alternately, the illumination source 212 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the optical assembly 200 included in the photolithography system, the optical assembly 200 need not be limited to a reduction system. It could also be a 1× or magnification system.

With respect to a optical assembly 200, when far ultra-violet rays such as the excimer laser is used, glass materials such as quartz and fluorite that transmit far ultra-violet rays is preferable to be used. When the $F_2$ type laser or x-ray is used, the optical assembly 200 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 13:
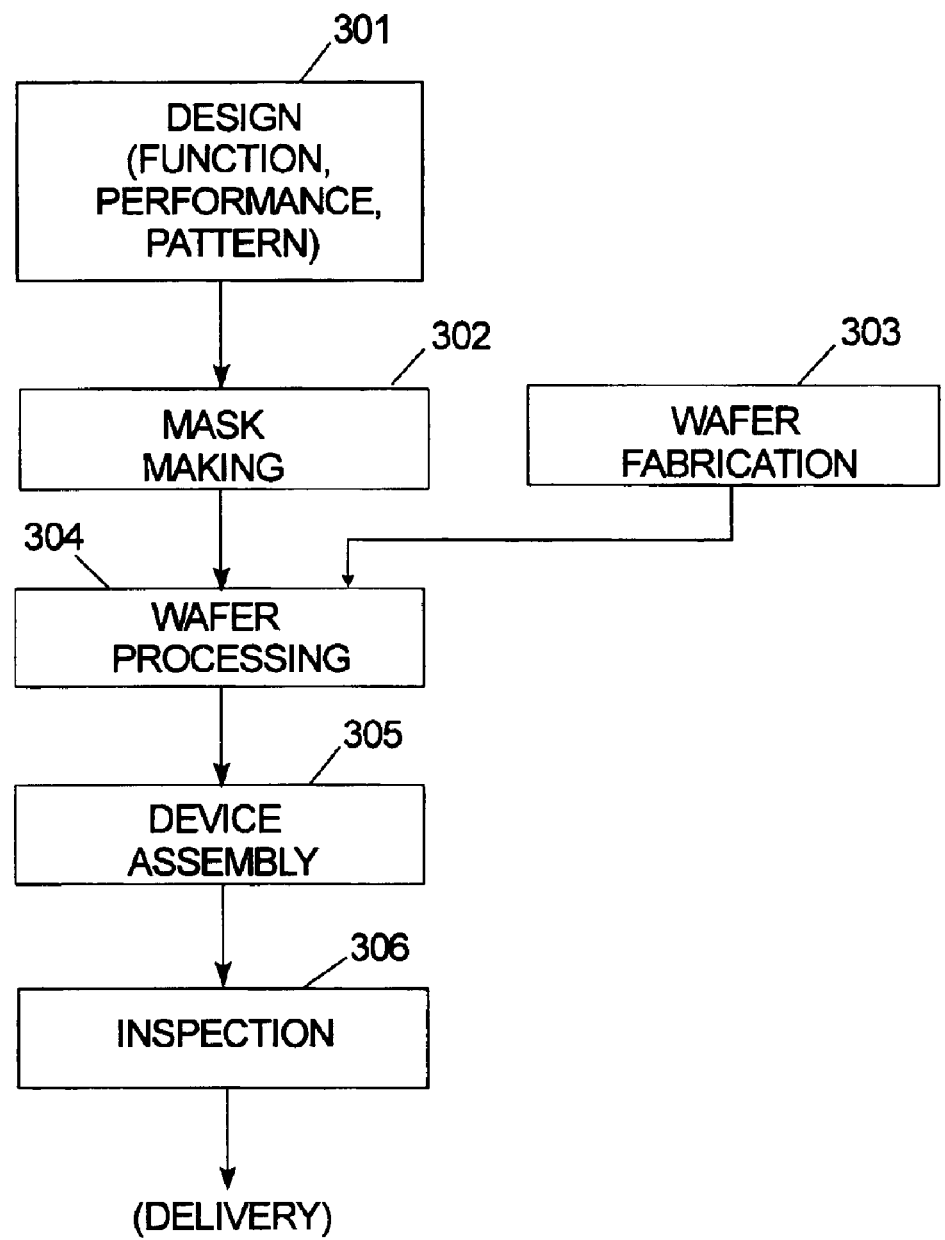
FIG. 13 is a flow chart that outlines a process for manufacturing a device in accordance with the present invention.

Further, semiconductor devices can be fabricated using the above described systems, by the process shown generally in FIG. 13. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), finally, the device is then inspected in step 306.

Figure 14:
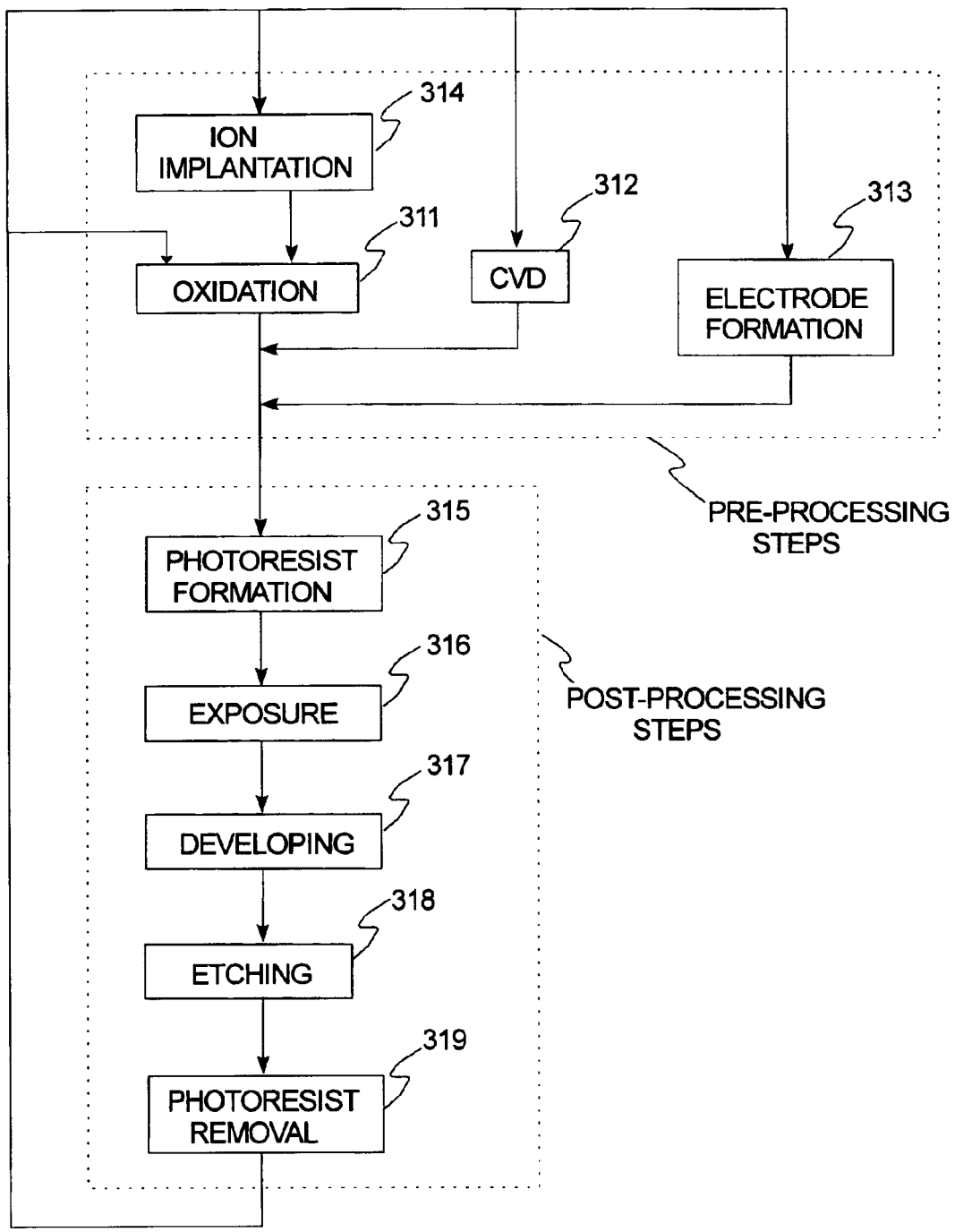
FIG. 14 is a flow chart that outlines device processing in more detail.

FIG. 14 illustrates a detailed flowchart example of the above-mentioned step 304 in the case of fabricating semiconductor devices. In FIG. 14, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular stage assembly 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly comprising:
   a first stage that retains a first device;
   a second stage that retains a second device;
   a mover assembly that moves the first stage and the second stage independently of each other, the first stage and the second stage being movable over a common operational area in each movement range;
   a first support assembly that supports the first stage independently from the second stage; and
   a second support assembly that supports the second stage independently from the first stage.

2. The stage assembly of claim 1 wherein the mover assembly includes a first mover assembly that moves the first stage into the operational area and a second mover assembly that moves the second stage into the operational area.

3. The stage assembly of claim 2 wherein the first mover assembly is substantially uncoupled from the second mover assembly.

4. The stage assembly of claim 1 wherein (i) the first support assembly includes a first base section and (ii) the second support assembly includes a second base section.

5. The stage assembly of claim 4 further comprising a first base flexible support that secures the first base section to a mounting base.

6. The stage assembly of claim 5 wherein the first base flexible support at least partly isolates the movement of the first base section relative to the second base section.

7. The stage assembly of claim 5 further comprising a second base flexible support that secures the second base section to the mounting base.

8. The stage assembly of claim 7 wherein the second base flexible support at least partly isolates the movement of the second base section relative to the first base section.

9. An exposure apparatus including the stage assembly of claim 1.

10. A stage assembly that independently moves a first device and a second device into an operational area, the stage assembly comprising:
   a first stage that retains the first device;
   a second stage that retains the second device;
   a mover assembly that moves the first stage and the second stage into the operational area;
   a first base section that supports the first stage, wherein the first base section includes a first base bottom, a left first base guide and a right first base guide; and
   a second base section that supports the second stage, wherein the second base section includes a second base bottom, a left second base guide and a right second base guide, wherein a portion of at least one of the first base guides extends over the second base section.

11. The stage assembly of claim 10 wherein a portion of at least one of the second base guides extends over the first base section.

12. The stage assembly of claim 11 wherein the base guides are positioned substantially parallel to each other.

13. The stage assembly of claim 10 wherein the first base section is independent of the second base section.

14. The stage assembly of claim 10 wherein the left first base guide and the right first base guide are independent of the left second base guide and the right second base guide.

15. The stage assembly of claim 10 wherein the mover assembly includes a first mover assembly that moves the first stage into the operational area and a second mover assembly that moves the second stage into the operational area.

16. The stage assembly of claim 15 wherein the first mover assembly is substantially uncoupled from the second mover assembly.

17. An exposure apparatus including the stage assembly of claim 10.

18. A stage assembly that independently moves a first device and a second device into an operational area, the stage assembly comprising:
   a first stage that retains the first device;
   a second stage that retains the second device;
   a mover assembly that moves the first stage and the second stage into the operational area;
   a first base section that supports the first stage, wherein the first base section includes a first base bottom, a left first base guide and a right first base guide; and
   a second base section that supports the second stage, wherein the second base section includes a second base bottom, a left second base guide and a right second base guide, wherein one of the first base guides is positioned between the second base guides.

19. The stage assembly of claim 18 wherein one of the second base guides is positioned between the first base guides.

20. The stage assembly of claim 19 wherein the base guides are positioned substantially parallel to each other.

21. The stage assembly of claim 18 wherein the first base section is independent of the second base section.

22. The stage assembly of claim 18 wherein the left first base guide and the right first base guide are independent of the left second base guide and the right second base guide.

23. The stage assembly of claim 18 wherein the mover assembly includes a first mover assembly that moves the first stage into the operational area and a second mover assembly that moves the second stage into the operational area.

24. The stage assembly of claim 23 wherein the first mover assembly is substantially uncoupled from the second mover assembly.

25. An exposure apparatus including the stage assembly of claim 18.

26. A stage assembly comprising:
   a first stage that retains a first device;
   a second stage that retains a second device;
   a mover assembly that moves the first stage and the second stage independently of each other, the first stage and the second stage being movable over a common operational area in each movement range;
   a first base section that supports the first stage;
   a second base section that supports the second stage; and
   a first base flexible support that secures the first base section to a mounting base, the first base section being supported independently from the second base section.

27. The stage assembly of claim 26 wherein the first base flexible support at least partly isolates the movement of the first base section relative to the second base section.

28. The stage assembly of claim 26 further comprising a second base flexible support that secures the second base section to the mounting base.

29. The stage assembly of claim 28 wherein the second base flexible support at least partly isolates the movement of the second base section relative to the first base section.

30. An exposure apparatus including the stage assembly of claim 26.

31. A method for making a stage assembly comprising the steps of:
   providing a first stage that retains a first device;
   providing a second stage that retains a second device;
   connecting a first mover assembly to the first stage, the first mover assembly moving the first stage and the second stage independently of each other, the first stage and the second stage being movable over a common operational area in each movement range;
   supporting the first stage with a first base section; and
   supporting the second stage with a second base section that is different from the first base section.

32. The method of claim 31 wherein the first base section is independent of the second base section.

33. A method for making an exposure apparatus that forms an image on a wafer, the method comprising the steps of:
   providing an irradiation apparatus that irradiates the wafer with radiation to form the image on the wafer; and
   providing the stage assembly made by the method of claim 31.

34. A method for making a stage assembly that independently moves a first device and a second device into an operational area, the method comprising the steps of:
   providing a first stage that retains the first device;
   providing a second stage that retains the second device;
   connecting a mover assembly to the first stage and the second stage, the mover assembly moving the first stage and the first device into the operational area and the second stage and the second device into the operational area;
   supporting the first stage with a first base section that includes a first base bottom, a left first base guide and a right first base guide; and
   supporting the second stage with a second base section that includes a second base bottom, a left second base guide and a right second base guide.

35. The method of claim 34 including the step of positioning a portion of at least one of the first base guides over the second base bottom.

36. The method of claim 34 including the step of positioning a portion of at least one of the second base guides over the first base bottom.

37. The method of claim 34 including the step of positioning one of the first base guides between the second base guides and the step of positioning one of the second base guides between the first base guides.

38. The method of claim 34 wherein the left first base guide and the right first base guide are independent of the left second base guide and the right second base guide.

39. A method for making an exposure apparatus that forms an image on a wafer, the method comprising the steps of:

provaiding an irradiation apparatus that irradiates the wafer with radiation to form the image on the wafer; and providing the stage assembly made by the method of claim 34.

40. A method for making a stage assembly that independently moves a first device and a second device into an operational area, the method comprising the steps of:

providing a first stage that retains the first device;

providing a second stage that retains the second device;

connecting a mover assembly to the first stage and the second stage, the mover assembly moving the first stage and the first device into the operational area and the second stage and the second device into the operational area;

supporting the first stage with a first base section;

supporting the second stage with a second base section; and securing the first base section to a mounting base with a first base flexible support.

41. The method of claim 40 wherein the step of securing the first base section includes the step of at least partly isolating the movement of the first base section relative to the second base section.

42. The method of claim 40 further comprising the step of securing the second base section to the mounting base with a second base flexible support.

43. The method of claim 42 wherein the step of securing the second base section includes the step of at least partly isolating the movement of the second base section relative to the first base section.

44. A method for making an exposure apparatus that forms an image on a wafer, the method comprising the steps of:

providing an irradiation apparatus that irradiates the wafer with radiation to form the image on the wafer; and providing the stage assembly made by the method of claim 40.

45. A stage assembly that independently moves a first device and a second device into an operational area, the stage assembly comprising:

a first stage that retains the first device;

a second stage that retains the second device;

a mover assembly that moves the first stage and the second stage into the operational area;

a first support assembly that supports the first stage independently from the second stage, the first support assembly including a first base section; and a second support assembly that supports the second stage independently from the first stage, the second support assembly including a second base section.

46. The stage assembly of claim 45 further comprising a first base flexible support that secures the first base section to a mounting base.

47. The stage assembly of claim 46 wherein the first base flexible support at least partly isolates the movement of the first base section relative to the second base section.

48. The stage assembly of claim 46 further comprising a second base flexible support that secures the second base section to the mounting base.

49. The stage assembly of claim 48 wherein the second base flexible support at least partly isolates the movement of the second base section relative to the first base section.

50. The stage assembly of claim 45 wherein the mover assembly includes a first mover assembly that moves the first stage into the operational area and a second mover assembly that moves the second stage into the operational area.

51. The stage assembly of claim 50 wherein the first mover assembly is substantially uncoupled from the second mover assembly.

52. An exposure apparatus including the stage assembly of claim 45.

53. A stage assembly that independently moves a first device and a second device into an operational area, the stage assembly comprising:

a first stage that retains the first device;

a second stage that retains the second device;

a mover assembly that moves the first stage and the second stage into the operational area;

a first base section that supports the first stage;

a second base section that supports the second stage;

a first base flexible support that secures the first base section to a mounting base; and a second base flexible support that secures the second base section to the mounting base.

* * * * *